(12) United States Patent
Sahoda et al.

(10) Patent No.: US 8,617,655 B2
(45) Date of Patent: Dec. 31, 2013

(54) COATING DEVICE AND COATING METHOD

(75) Inventors: Tsutomu Sahoda, Kawasaki (JP);
Futoshi Shimai, Kawasaki (JP);
Akihiko Sato, Kawasaki (JP)

(73) Assignee: Tokyo Ohka Kogyo Co., Ltd.,
Kawasaki-shi (JP)

( * ) Notice: Subject to any disclaimer, the term of this patent is extended or adjusted under 35 U.S.C. 154(b) by 364 days.

(21) Appl. No.: 12/777,081

(22) Filed: May 10, 2010

(65) Prior Publication Data

US 2010/0297352 A1  Nov. 25, 2010

(30) Foreign Application Priority Data

May 22, 2009  (JP) ................. P2009-124029

(51) Int. Cl.
*B05D 3/10* (2006.01)
*B05D 1/18* (2006.01)

(52) U.S. Cl.
USPC ............. 427/337; 118/52; 118/315; 118/500; 118/612; 134/104.1; 216/91

(58) Field of Classification Search
USPC ............... 427/337; 134/34, 78, 79, 80, 104.2, 134/104.3, 104.4; 438/14, 906; 118/320, 118/56, 70, 416; 216/91
See application file for complete search history.

(56) References Cited

U.S. PATENT DOCUMENTS

| | | | |
|---|---|---|---|
| 5,688,411 A * | 11/1997 | Kutsuzawa et al. | 216/92 |
| 6,015,467 A | 1/2000 | Nagasawa et al. | |
| 6,106,618 A * | 8/2000 | Gilmer et al. | 118/52 |
| 6,238,511 B1 | 5/2001 | Sada et al. | |
| 2002/0152958 A1 | 10/2002 | Shigemori et al. | |
| 2004/0134425 A1* | 7/2004 | Kitano et al. | 118/676 |
| 2004/0168633 A1* | 9/2004 | Nozawa et al. | 118/719 |
| 2004/0202793 A1* | 10/2004 | Harper et al. | 427/430.1 |
| 2007/0204881 A1* | 9/2007 | Wakuda et al. | 134/10 |
| 2010/0196596 A1 | 8/2010 | Hirose et al. | |
| 2011/0027478 A1 | 2/2011 | Fukushima et al. | |

FOREIGN PATENT DOCUMENTS

| | | |
|---|---|---|
| JP | 02-014512 | 1/1990 |
| JP | A-04-119524 | 4/1992 |
| JP | U-A-06-038008 | 5/1994 |
| JP | H07-130642 | 5/1995 |
| JP | 09205073 A * | 8/1997 |
| JP | 10092889 A * | 4/1998 |
| JP | 2000305287 | 11/2000 |

(Continued)

OTHER PUBLICATIONS

Office Action issued on Jan. 24, 2013 for U.S. Appl. No. 12/847,912.

(Continued)

*Primary Examiner* — Alexander Weddle
(74) *Attorney, Agent, or Firm* — Knobbe Martens Olson & Bear LLP

(57) ABSTRACT

A coating device includes a coating mechanism which includes nozzles for ejecting a liquid material onto front and rear surfaces of a substrate while rotating the substrate; and an adjusting mechanism which adjusts the coating state of the liquid material at the outer periphery of the substrate; wherein the adjusting mechanism includes a dip portion which dips the outer periphery of the substrate in a solution while rotating the substrate and dissolves; and a suction portion which suctions the vicinity of the outer periphery of the substrate after dipping in the solution.

9 Claims, 16 Drawing Sheets

(56) References Cited

FOREIGN PATENT DOCUMENTS

| | | |
|---|---|---|
| JP | A-2003-257840 | 9/2003 |
| JP | A-2004-306032 | 11/2004 |
| JP | A-2009-070507 | 4/2009 |
| JP | A-2009-245513 | 10/2009 |

OTHER PUBLICATIONS

Notice of Allowance dated Jun. 25, 2013 in U.S. Appl. No. 12/847,912.

Office Action issued on Aug. 20, 2013 in Japanese Patent Application No. 2009-124029.

\* cited by examiner

COATING DEVICE AND COATING METHOD

BACKGROUND OF THE INVENTION

1. Field of the Invention

The present invention relates to a coating device and a coating method.

Priority is claimed on Japanese Patent Application No. 2009-124029, filed on May 22, 2009, the contents of which are incorporated herein by reference.

2. Description of the Related Art

For example, upon forming a thin film such as a resist film on various substrates such as a semiconductor substrate, a glass substrate forming a liquid crystal panel, and a substrate forming a hard disk, a coating device is used to form the coating film on the substrate while rotating the substrate. In the coating device, in general, the substrate is laid down so as to be parallel to a horizontal plane and the substrate is rotated while the lower substrate surface is held.

Meanwhile, in the substrate used to form the hard disk, for example, it is necessary to coat the liquid material on both surfaces thereof. In the case of this kind of substrate in which both surfaces are required to be coated with the liquid material, it is not possible to hold the lower substrate surface. For this reason, Patent Reference 1, for example, discloses a technology in which the substrate is rotated while the substrate is held by a holding piece.

In the case where the liquid material is coated on both surfaces of the substrate when the substrate is laid down, the coating conditions between the top and bottom surfaces of the substrate are different. For this reason, the state of the thin film formed on the top surface of the substrate may be different from the state of the thin film formed on the bottom surface thereof. To the contrary, there has recently been proposed a technology in which the liquid material is simultaneously coated on both surfaces of the substrate in an upright (i.e. vertical) state.

[Patent Reference 1]
Japanese Unexamined Patent Application, First Publication No. Hei 7-130642

It is required that the liquid material at the outer periphery of the substrate be in a satisfactory coating state when the liquid material is coated on the substrate. As a matter of course, a satisfactory coating state is similarly required when the liquid material is coated on the substrate in an upright state.

SUMMARY OF THE INVENTION

In consideration of the above-described circumstance, an object of the invention is to provide a coating device and a coating method, which are capable of improving the coating state of the peripheral edge of the substrate.

According to a first aspect of the invention, there is provided a coating device including a coating mechanism which includes nozzles for ejecting a liquid material onto front and rear surfaces of the substrate while rotating the substrate in an upright state; and an adjusting mechanism which adjusts the coating state of the liquid material at the outer periphery of the substrate; wherein the adjusting mechanism includes a dip portion which dips the outer periphery of the substrate in a solution while rotating the substrate and dissolves; and a suction portion which suctions the vicinity of the outer periphery of the substrate after dipping in the solution.

According to this aspect, since the coating device is provided with an adjusting mechanism which adjusts the coating state of the liquid material at the outer periphery of the substrate, it becomes possible to improve the coating state of the peripheral edge of the substrate. In addition, since the adjusting mechanism includes a dip portion which dips the outer periphery of the substrate in a solution while rotating the substrate and dissolves, and a suction portion which suctions the vicinity of the outer periphery of the substrate after dipping in the solution, it becomes possible to improve the coating state of the peripheral edge of the substrate more reliably.

In the coating device, the adjusting mechanism preferably includes a liquid level adjusting portion which adjusts the liquid level of the solution.

In this case, since the adjusting mechanism may include a liquid level adjusting portion which adjusts the liquid level of the solution, it is possible to adjust the dipping depth of the substrate to be dipped in the solution. Accordingly, it is possible to suppress the variation in the dissolved amount of the coating liquid in the peripheral edge of the substrate.

In the coating device, the adjusting mechanism may include a discharging portion which discharges the solution of the dip portion.

In this case, since the adjusting mechanism includes a discharging portion which discharges the solution of the dip portion, for example, it is possible to discharge the solution contaminated by dissolving the liquid material thereby to clean the dip portion and to adjust the amount of the solution in the dip portion.

The coating device may further include a carrying mechanism which carries the substrate between the coating mechanism and the adjusting mechanism, and the adjusting mechanism may include a cleaning portion which cleans the carrying mechanism.

In this case, since a carrying mechanism which carries the substrate between the coating mechanism and the adjusting mechanism can be cleaned, it is possible to cleanly maintain the carrying mechanism. Accordingly, it is possible to prevent the substrate from being contaminated through the carrying mechanism.

In the coating device, the cleaning portion may include a second dip portion which dips a portion of the carrying mechanism in a solution and dissolves.

In this case, since the cleaning portion may include a second dip portion which dips a portion of the carrying mechanism in a solution and dissolves, it is possible to easily clean the carrying mechanism In the coating device, the suction portion may be formed in a shape of interposing a portion of the substrate therebetween.

In this case, since the suction portion is formed in a shape of interposing a portion of the substrate therebetween, both surfaces of the substrate are uniformly suctioned. Accordingly, it is possible to prevent one surface of the substrate from being suctioned non-uniformly and to make the coating state of both surfaces of the substrate uniform.

In the coating device, the suction portion may include a depth adjusting portion which adjusts the interposing depth of the substrate.

In this case, since the suction portion includes a depth adjusting portion which adjusts the interposing depth of the substrate, it is possible to adjust the depth of the portion to be suctioned by the suction portion for every substrate. Accordingly, it is possible to make the coating state of the peripheral edge of the substrate uniform.

The coating device may further include a raising and lowering mechanism which raises and lowers the adjusting mechanism.

In this case, since the coating device further includes a raising and lowering mechanism which raises and lowers the adjusting mechanism, it is possible to access by raising and lowering the adjusting mechanism according to the height of the substrate.

The coating device may further include a second adjusting mechanism including an adjusting nozzle which adjusts the liquid material at the outer periphery of the substrate by ejecting the solution; and may further include a control portion which changes an adjusting operation of the coating state by the adjusting mechanism, and an adjusting operation of the coating state by the second adjusting mechanism.

In this case, since the coating device further includes a second adjusting mechanism including an adjusting nozzle which adjusts the liquid material at the outer periphery of the substrate by ejecting the solution; and further includes a control portion which changes an adjusting operation of the coating state by the adjusting mechanism, and an adjusting operation of the coating state by the second adjusting mechanism, it is possible to perform the operation of adjusting the coating state at the outer periphery of the substrate by flexibly changing according to the coating situation.

According to a second aspect of the invention, there is provided a coating method including the steps of ejecting a liquid material onto front and rear surfaces of the substrate through a nozzle while rotating the substrate in an upright state; and adjusting the coating state of the liquid material at the outer periphery of the substrate; wherein the adjusting step includes the steps of dipping in which the outer periphery of the substrate is dipped in a solution while rotating the substrate and dissolved; and suctioning the vicinity of the outer periphery of the substrate after dipping in the solution.

According to this aspect, since the coating state of the liquid material at the outer periphery of the substrate is adjusted in the adjusting step, it becomes possible to improve the coating state of the peripheral edge of the substrate. In addition, since the steps of dipping in which the outer periphery of the substrate is dipped in a solution while rotating the substrate and dissolved, and suctioning the vicinity of the outer periphery of the substrate after dipping in the solution are performed in the adjusting step, it becomes possible to improve the coating state of the peripheral edge of the substrate more reliably.

The coating method may include the step of adjusting the liquid level of the solution.

In this case, since the step of adjusting the liquid level of the solution is performed in the adjusting step, it becomes possible to improve the peripheral edge of the substrate more reliably.

In the coating method, the adjusting step may include the step of discharging the solution used in the dipping step.

In this case, since the step of discharging the solution used in the dipping step is performed in the adjusting step, it is possible to adjust the dipping depth of the substrate to be dipped in the solution. Accordingly, it is possible, for example, to discharge the solution contaminated by dissolving the liquid material, or to adjust the amount of the solution used in the dipping step.

The coating method may further include the step of carrying the substrate between the coating step and the adjusting step, and the adjusting step may include the step of cleaning the carrying mechanism.

In this case, since the step of carrying the substrate is performed between the coating step and the adjusting step, and the step of cleaning the carrying mechanism is performed in the adjusting step, it is possible to clean the carrying mechanism and to cleanly maintain the carrying mechanism. Accordingly, it is possible to prevent the substrate from being contaminated through the carrying mechanism.

In the coating method, the cleaning step may include the second dipping step in which a portion of the carrying mechanism is dipped in a solution and dissolved.

In this case, since the second dipping step in which a portion of the carrying mechanism is dipped in a solution and dissolved is performed in the cleaning step, it is possible to easily clean the carrying mechanism.

In the coating method, the suctioning step may be the step of suctioning at the position where a portion of the substrate is interposed therebetween.

In this case, since suctioning is performed at the position where a portion of the substrate is interposed therebetween in the suctioning step, both surfaces of the substrate are uniformly suctioned. Accordingly, it is possible to prevent one surface of the substrate from being suctioned non-uniformly and to make the coating state of both surfaces of the substrate uniform.

In the coating method, the suctioning step may include the step of adjusting the interposing depth of the substrate.

In this case, since the step of adjusting the interposing depth of the substrate is performed in the suctioning step, it is possible to adjust the depth of the portion to be suctioned by the suction portion for every substrate. Accordingly, it is possible to make the coating state of the peripheral edge of the every substrate uniform since the suction state of the peripheral edge of the every substrate can be made uniform.

The coating method may further include the adjusting position raising and lowering step of raising and lowering the adjusting position of the coating state.

In this case, since the adjusting position raising and lowering step of raising and lowering the adjusting position of the coating state is further performed, it is possible to access by raising and lowering the adjusting mechanism according to the height of the substrate.

The coating method may further include the step of second adjusting in which the coating state of the liquid material at the outer periphery of the substrate is adjusted by ejecting the solution using an adjusting nozzle; and selecting the adjusting step and the second adjusting step.

In this case, since the step of second adjusting in which the coating state of the liquid material at the outer periphery of the substrate is adjusted by ejecting the solution using an adjusting nozzle, and selecting the adjusting step and the second adjusting step are performed, it is possible to perform the operation of adjusting the coating state at the outer periphery of the substrate by flexibly changing according to the coating situation.

According to the present invention, it is possible to provide a coating device and a coating method, which are capable of improving the coating state of the peripheral edge of the substrate.

DETAILED DESCRIPTION OF THE INVENTION

The exemplary embodiments of the invention will be described with reference to the accompanying drawings.

Figure 1:
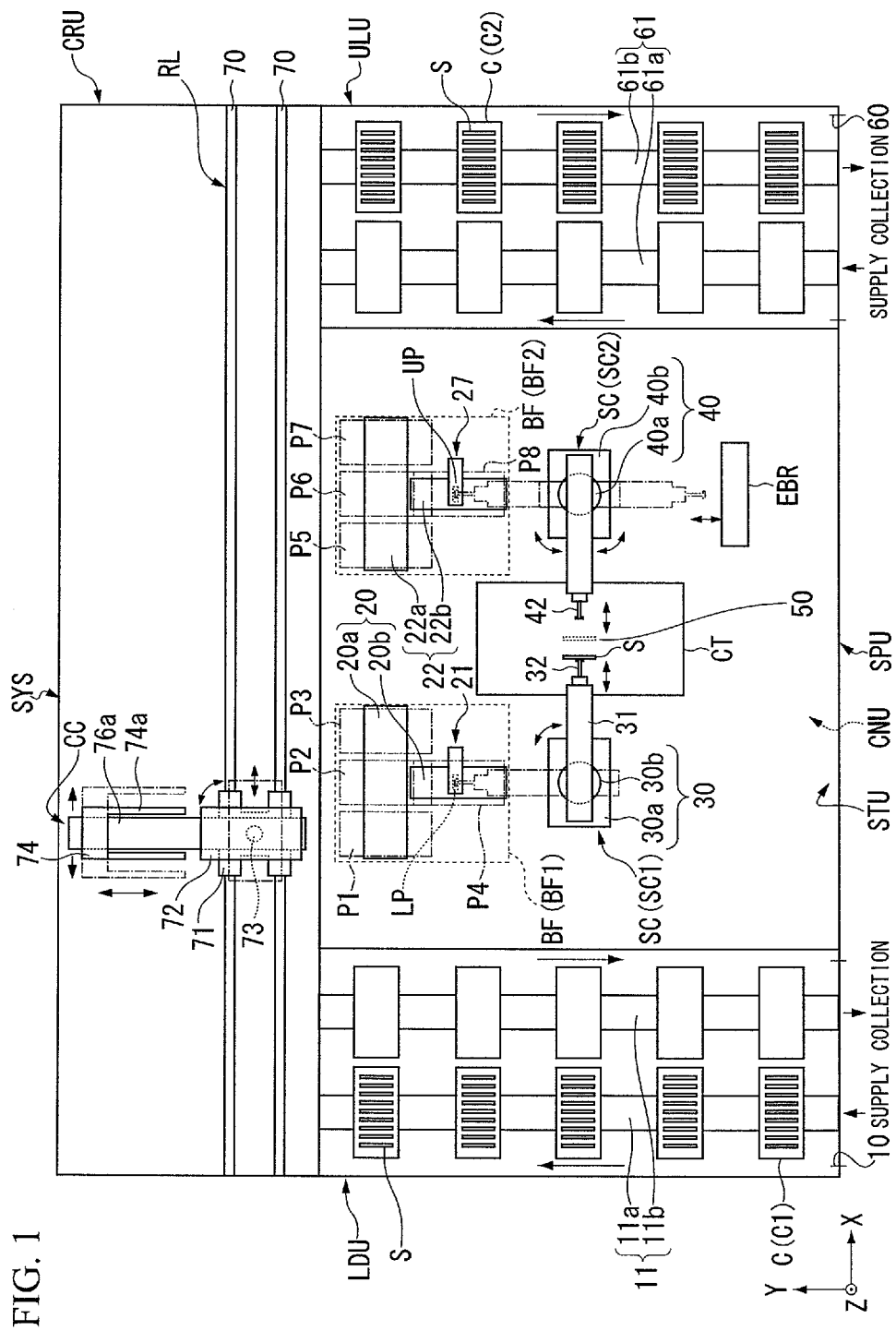
FIG. 1 is a plan view showing a constitution of a substrate processing system according to the embodiment of the invention.
Figure 2:
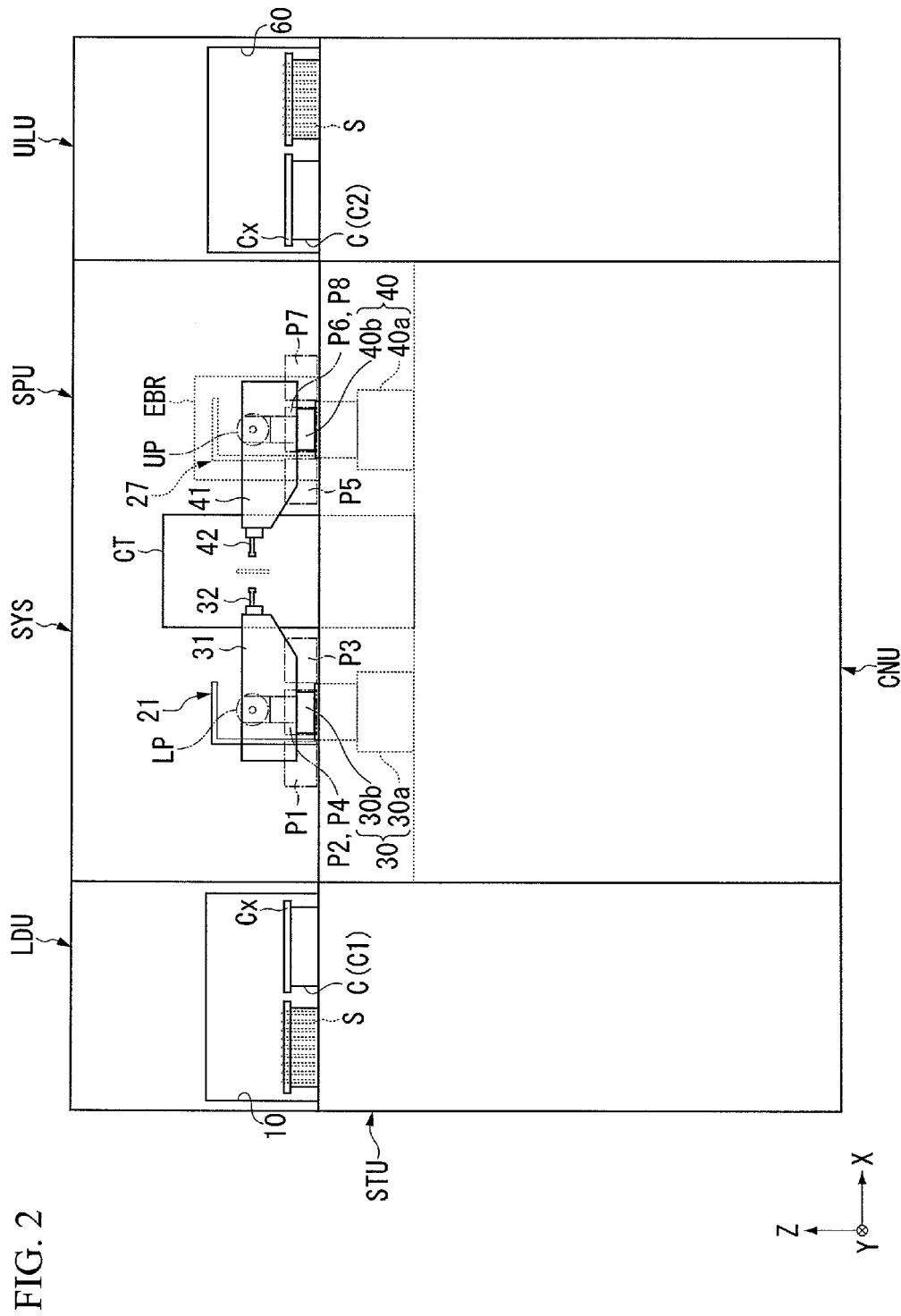
FIG. 2 is a front view showing the constitution of the substrate processing system according to the embodiment of the invention.
Figure 3:
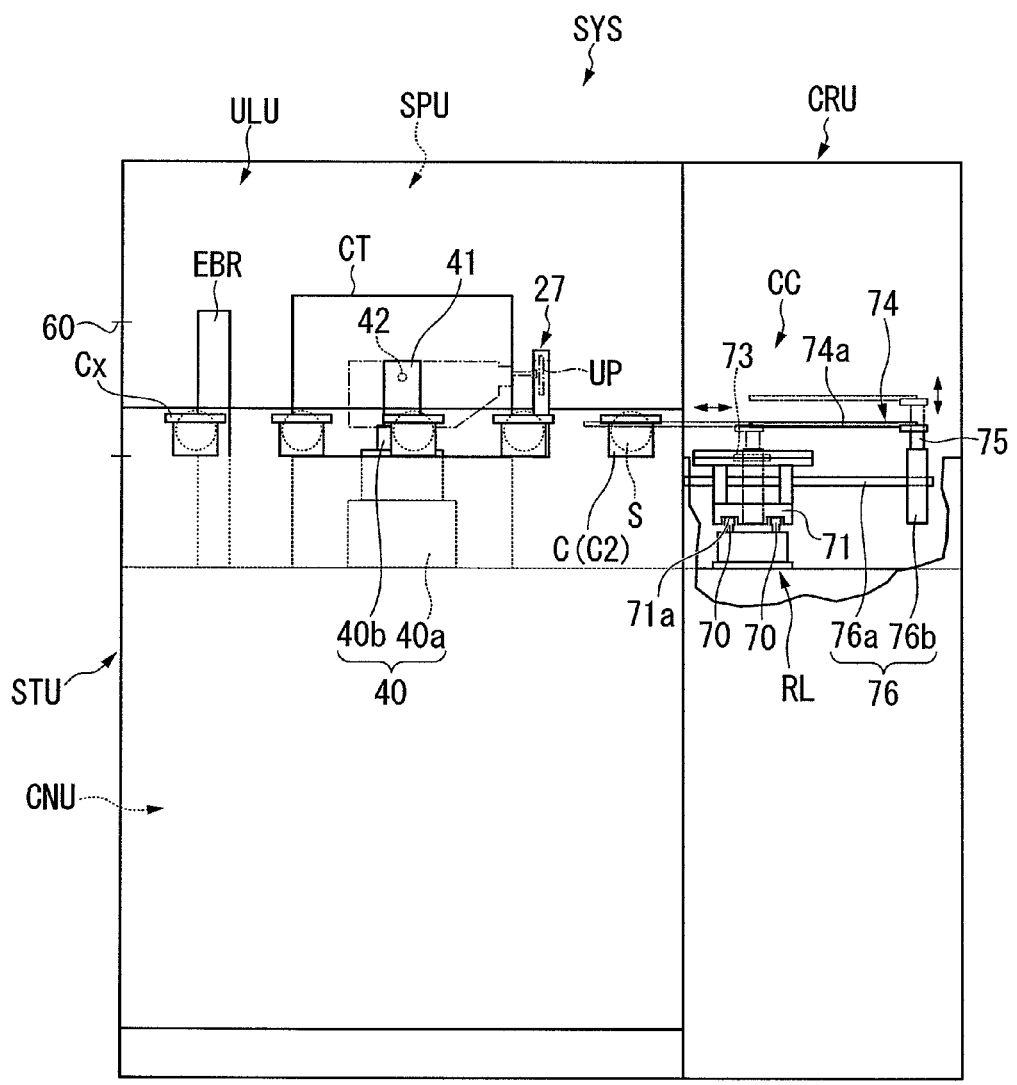
FIG. 3 is a side view showing the constitution of the substrate processing system according to the embodiment of the invention.

FIG. 1 is a plan view showing a schematic constitution of a substrate processing system SYS according to the embodiment of the invention. FIG. 2 is a front view showing the schematic constitution of the substrate processing system SYS. FIG. 3 is a side view showing the schematic constitution of the substrate processing system SYS.

In the embodiment, when describing the constitution of the substrate processing system SYS, for the purpose of simple markings, an XYZ coordinate system is used to describe the directions in the drawings. In the XYZ coordinate system, the horizontal direction in the drawing is marked as the X direction, and the direction perpendicular to the X direction in plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

As shown in FIGS. 1 to 3, the substrate processing system SYS is a system which is incorporated into, for example, a manufacturing line of a factory or the like and forms a thin film on a predetermined area of a substrate S. The substrate processing system SYS includes a stage unit STU, a substrate processing unit (coating device) SPU, a substrate loading unit LDU, a substrate unloading unit ULU, a carrying unit CRU, and a control unit CNU.

In the substrate processing system SYS, the stage unit STU is supported on a floor surface through, for example, a bridge member or the like. The substrate processing unit SPU, the substrate loading unit LDU, the substrate unloading unit ULU, and the carrying unit CRU are disposed on the upper surface of the stage unit STU. In the substrate processing unit SPU, each inside of the substrate loading unit LDU, the substrate unloading unit ULU, and the carrying unit CRU is covered by a cover member. In the substrate processing system SYS, the substrate processing unit SPU, the substrate loading unit LDU, and the substrate unloading unit ULU are arranged in a linear shape along the X direction. The substrate processing unit SPU is disposed between the substrate loading unit LDU and the substrate unloading unit ULU. In a portion of the stage unit STU where the substrate processing unit SPU is disposed, a center thereof in plan view is recessed in the −Z direction relative to other portions.

As the substrate S as a processing object of the substrate processing system SYS according to the embodiment, for example, a semiconductor substrate such as silicon, a glass substrate forming a liquid crystal panel, a substrate forming a hard disk, and the like may be exemplified. In the embodiment, as the substrate S, a substrate which forms a hard disk is an exemplary example. The substrate is formed of glass, and is formed as a disk-shaped base, of which a surface is coated with diamond and in which an opening is formed at the center thereof in plan view.

A loading operation and an unloading operation of the substrate S in the substrate processing system SYS according to the embodiment are performed by a cassette C capable of accommodating plural sheets of the substrates S. The cassette C is a container formed in a square shape, and is capable of accommodating plural sheets of substrates S in series so that the substrate surfaces face each other. Accordingly, the cassette C is configured to accommodate the substrates S in the state where the substrates S erect in the Z direction. The cassette C has an opening formed in a bottom portion thereof. Each of the substrates S is accommodated so as to be exposed from the bottom portion of the cassette C through the opening. The cassette C is formed in a rectangular shape in plan view, and has, for example, an engagement portion Cx formed in the +Z direction side edge portion as shown in FIG. 2. In the embodiment, as the cassette C, two types of cassettes, that is, a loading cassette C1 for loading the substrate S and an unloading cassette C2 for unloading the substrate S are used. The loading cassette C1 accommodates only the unprocessed substrate S, and the unloading cassette C2 accommodates only the processed substrate S. The loading cassette C1 is used between the substrate processing unit SPU and the substrate loading unit LDU. The unloading cassette C2 is used between the substrate processing unit SPU and the substrate unloading unit ULU. Accordingly, the loading cassette C1 and the unloading cassette C2 are not used together. The loading cassette C1 and the unloading cassette C2 are formed to have, for example, the same shape and size.

Substrate Loading Unit

The substrate loading unit LDU is disposed on the −X direction side of the substrate processing system SYS. The substrate loading unit LDU is a unit which receives the loading cassette C1 accommodating the unprocessed substrate 5, and collects the empty loading cassette C1. The substrate loading unit LDU is elongated in the Y direction, and is capable of accommodating plural loading cassettes C1 arranged in the Y direction in a standby state.

The substrate loading unit LDU includes a cassette entrance 10 and a cassette moving mechanism (second moving mechanism) 11. The cassette entrance 10 is an opening which is provided in the −Y direction side of the cover member covering the substrate loading unit LDU. The cassette entrance 10 is an inlet (supply opening) for the loading cassette C1 accommodating the unprocessed substrates S, and an outlet (collection opening) for the empty loading cassette C1.

The cassette moving mechanism 11 includes, for example, a driving mechanism such as a belt conveyor mechanism. In the embodiment, as the driving mechanism, conveyor belts (a supply belt 11a and a collection belt 11b) are provided. The conveyor belts extend in the Y direction from the +Y direction side end portion of the substrate loading unit LDU to the −Y direction side end portion thereof, where two conveyor belts extend in the X direction.

Among the two conveyor belts, the supply belt 11a is a conveyor belt which is disposed on the −X direction side. The +Z direction side surface of the supply belt 11a is used as a conveyor surface. The supply belt 11a is configured to rotate so that the conveyor surface moves in the −Y direction. Plural loading cassettes C1, which enter the substrate loading unit LDU through the cassette entrance 10, are placed on the conveyor surface of the supply belt 11a. The loading cassettes C1 are moved to the carrying unit CRU by rotation of the supply belt 11a.

Among two conveyor belts, the collection belt 11b is a conveyor belt which is disposed on the +X direction side. The +Z direction side surface of the collection belt 11b is used as a conveyor surface. The collection belt 11b is configured to rotate so that the conveyor surface moves in the −Y direction. Plural empty loading cassettes C1 are placed on the conveyor surface of the collection belt 11b. The loading cassettes C1 are made to move to the cassette entrance 10 by rotation of the collection belt 11b.

In the embodiment, for example, the loading cassettes C1 are capable of staying in a standby state at standby positions (container standby portion) provided at five positions on the supply belt 11a and the collection belt 11b. In the substrate loading unit LDU, it is possible to move the standby position of the loading cassette C1 by rotating the supply belt 11a and the collection belt 11b. It is possible to shorten the carrying time of the loading cassette C1 by moving the standby position.

Substrate Processing Unit

The substrate processing unit SPU is disposed in the substrate processing system SYS so as to be substantially located at the center in the X direction. The substrate processing unit SPU is a unit which performs various processes such as a process of coating a liquid material such as resist on the substrate S so as to form a thin film thereon and a process of removing the thin film formed on the peripheral portion of the substrate S. The substrate processing unit SPU includes a buffer mechanism BF, a substrate carrying mechanism (rotary mechanism) SC, a coating mechanism CT, and a peripheral edge removing mechanism (adjusting portion) EBR.

The buffer mechanisms BF are respectively provided at two positions along the +Y direction side edge of the substrate processing unit SPU with the coating mechanism CT interposed therebetween in the X direction. Among the buffer mechanisms BF at two positions, the buffer mechanism disposed on the −X direction side of the coating mechanism CT is a loading buffer mechanism (substrate loading area) BF1, and the buffer mechanism disposed on the +X direction side of the coating mechanism CT is an unloading buffer mechanism (substrate unloading area) BF2.

The loading buffer mechanism BF1 is a portion where the loading cassette C1 supplied to the substrate processing unit SPU stays in a standby state. The loading buffer mechanism BF1 is provided with a cassette moving mechanism (third moving mechanism) 20. The cassette moving mechanism 20 includes, for example, a driving mechanism such as a conveyor mechanism. In the embodiment, as the driving mechanism, two conveyor belts 20a and 20b are provided.

The conveyor belt 20a is provided in an area in the X direction of the loading buffer mechanism BF1. The +Z direction side surface of the conveyor belt 20a is used as a conveyor surface, and the supplied loading cassette C1 is placed on the conveyor surface. The conveyor belt 20a is adapted to rotate so that the conveyor surface moves in X direction. It is possible to move the loading cassette C1 in the X direction of the loading buffer mechanism BF1 by rotating the conveyor belt 20a. The conveyor belt 20b is provided at the center in the X direction of the loading buffer mechanism BF1. The +Z direction side surface of the conveyor belt 20b is used as a conveyor surface, and the loading cassette C1 is placed on the conveyor surface. The conveyor belt 20b is adapted to rotate so that the conveyor surface moves in the Y direction. By the rotation of the conveyor belt 20b, the loading cassette C1 moves in the Y direction. In this manner, the cassette moving mechanism 20 moves the standby position of the loading cassette C1.

In the loading buffer mechanism BF1, plural, for example, three, loading cassettes C1 are arranged in the X direction of the formation area of the conveyor belt 20a so as to stay in a standby state (second container standby portion). The standby position P1 on the −X direction side of the drawing is, for example, a standby position for the loading cassette C1 supplied to the substrate processing unit SPU. The standby position P2 at the center in the X direction of the drawing is a standby position for the loading cassette C1 moving from the standby position P1. The standby position P3 on the +X direction side of the drawing is a standby position for the loading cassette C1 moving from the standby position P2.

The +Y direction side end portion of the conveyor belt 20b is disposed inside the standby position P2. For this reason, the loading cassette C1 disposed at the standby position P2 moves in the −Y direction side relative to the standby position P2 by the conveyor belt 20b, and stays at the standby position P4 in a standby state. A loading position LP for the substrate S is provided on the +Z direction side of the standby position P4. The substrate S is carried to the coating mechanism CT through the loading position LP.

The unloading buffer mechanism BF2 is a portion of the substrate processing unit SPU where the unloading cassette C2 supplied to the substrate processing unit SPU stays in a standby state. The unloading buffer mechanism BF2 is provided with a cassette moving mechanism (third moving mechanism) 22. The cassette moving mechanism 22 includes, for example, a driving mechanism such as a belt conveyor. In the embodiment, as in the loading buffer mechanism BF1, two conveyor belts 22a and 22b are provided as the driving mechanism.

The conveyor belt 22a is provided in an area in the X direction of the unloading buffer mechanism BF2. The +Z direction side surface of the conveyor belt 22a is used as a conveyor surface, and the supplied unloading cassette C2 is placed on the conveyor surface. The conveyor belt 22a is adapted to rotate so that the conveyor surface moves in the X direction. It is possible to move the unloading cassette C2 in the X direction of the unloading buffer mechanism BF2 by rotating of the conveyor belt 22a. The conveyor belt 22b is provided at the center in the X direction of the unloading buffer mechanism BF2. As in the conveyor belt 20b, the +Z direction side surface of the conveyor belt 22b is used as a conveyor surface, and the unloading cassette C2 is placed on the conveyor surface. The conveyor belt 22b is adapted to rotate so that the conveyor surface moves in the Y direction. By the rotation of the conveyor belt 22b, the unloading cassette C2 moves in the Y direction. In this manner, the cassette moving mechanism 22 moves the standby position of the unloading cassette C2.

In the unloading buffer mechanism BF2, plural, for example, three, unloading cassettes C2 are arranged in the X direction on the conveyor belt 22a so as to stay in a standby state (second container standby portion). The standby position P5 on the −X direction side of the drawing is, for example, a standby position for the unloading cassette C2 supplied to the substrate processing unit SPU. The standby position P6 at the center in the X direction of the drawing is a standby position for the unloading cassette C2 moving from the standby position P5. The standby position P7 on the +X direction side of the drawing is a standby position for the unloading cassette C2 moving from the standby position P6.

The +Y-direction-side end portion of the conveyor belt 22b is disposed inside the standby position P6. For this reason, the unloading cassette C2 disposed at the standby position P6 moves in the −Y direction side relative to the standby position P6 by the conveyor belt 22b, and stays at the standby position P8 in a standby state. An unloading position UP for the substrate S is provided on the +Z direction side of the standby position P8. The substrate S is carried from the coating mechanism CT to the unloading cassette C2 through the unloading position UP.

Figure 4:
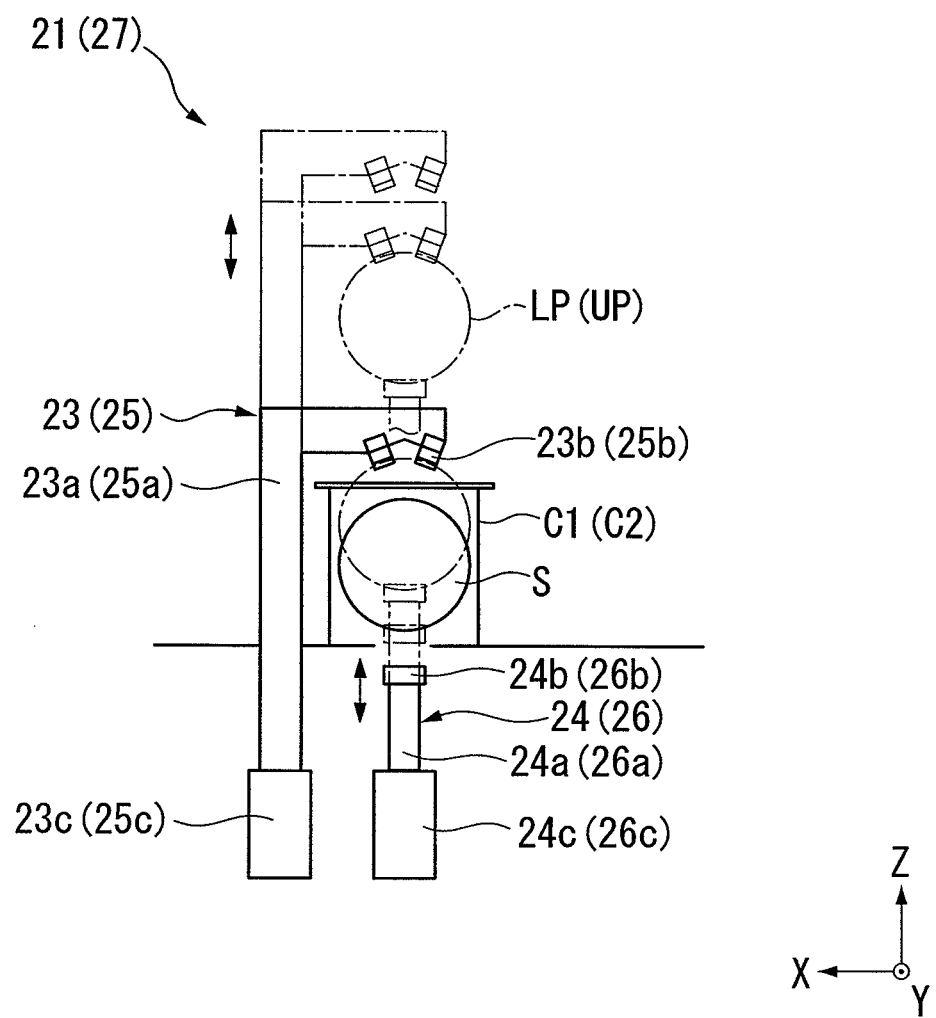
FIG. 4 is a view showing a constitution of a substrate loading mechanism and a substrate unloading mechanism.
Figure 5:
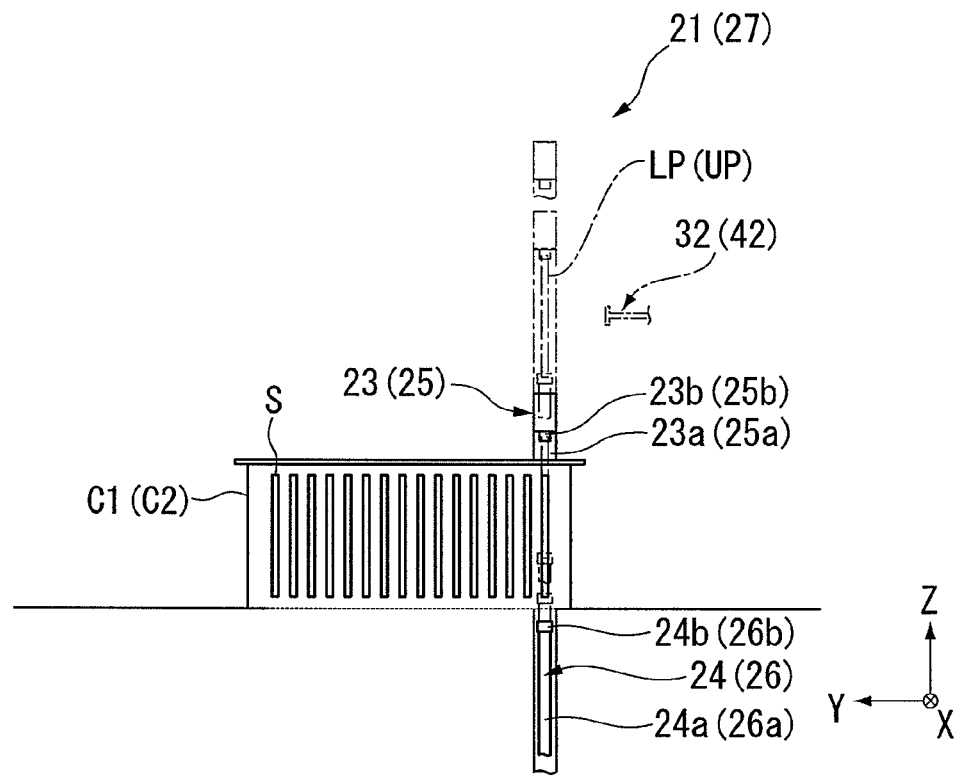
FIG. 5 is a view showing the constitution of the substrate loading mechanism and the substrate unloading mechanism.
Figure 6:
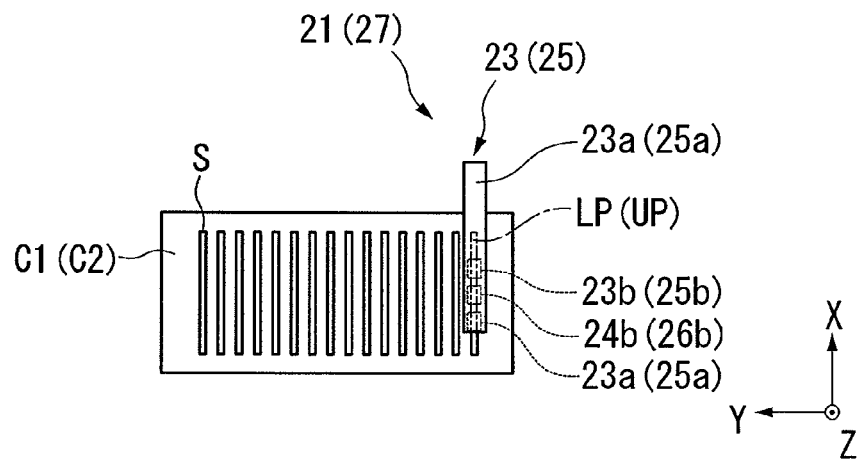
FIG. 6 is a view showing the constitution of the substrate loading mechanism and the substrate unloading mechanism.

The substrate processing unit SPU includes a substrate loading mechanism 21 and a substrate unloading mechanism 27 in the vicinity of the buffer mechanism BF. The substrate loading mechanism 21 is disposed in the vicinity of the standby position P4. FIGS. 4 to 6 are views schematically showing a constitution of the substrate loading mechanism 21.

As shown in the drawings, the substrate loading mechanism 21 includes a substrate upper portion holding mechanism 23 and a substrate lower portion holding mechanism 24. The substrate upper portion holding mechanism 23 is disposed on the +X direction side of the standby position P4. The substrate upper portion holding mechanism 23 moves in the Z direction while holding the +Z direction side portion of the substrate S. The substrate upper portion holding mechanism 23 includes a raising and lowering member 23a, a clamping member 23b, and a raising and lowering mechanism 23c.

The raising and lowering member 23a is a column member which is formed in an L-shape in side view and is movable in the Z direction. The raising and lowering member 23a includes a column portion which extends in the Z direction and a protrusion which protrudes from the front end of the column portion in the X direction. Among them, the column portion is provided up to the +Z direction side of the +Z direction side end surface of the loading cassette C1. The protrusion of the raising and lowering member 23a is disposed at a position overlapping with the loading position LP in plan view. The −Z direction side portion of the protrusion is provided with a concave portion matching with the shape of the substrate S.

The clamping member 23b is mounted to the concave portion of the raising and lowering member 23a. Accordingly, the clamping member 23b is provided at a position overlapping with the loading position LP in plan view. The raising and lowering mechanism 23c is a driving portion which is mounted to the raising and lowering member 23a, and is disposed on the −Z direction side of the loading cassette C1. As the raising and lowering mechanism 23c, for example, a driving mechanism such as an air cylinder may be used.

The substrate lower portion holding mechanism 24 is provided at a position overlapping with the center of the loading position LP in plan view. The substrate lower portion holding mechanism 24 moves in the Z direction while holding the −Z direction side portion of the substrate S. The substrate lower portion holding mechanism 24 includes a raising and lowering member 24a, a clamping member 24b, and a raising and lowering mechanism 24c. The raising and lowering member 24a is a column member which is formed in a bar shape and is movable in the Z direction. The clamping member 24b is mounted to the +Z direction side front end of the raising and lowering member 24a. The clamping member 24b is disposed at a position overlapping with the center of the loading position LP in plan view. The raising and lowering mechanism 24c is a driving portion which is mounted to the raising and lowering member 24a, and is disposed on the −Z direction side of the loading cassette C1. As the raising and lowering mechanism 24c, for example, a driving mechanism such as an air cylinder may be used.

It is possible to separately operate the raising and lowering mechanism 23e of the substrate upper portion holding mechanism 23 and the raising and lowering mechanism 24c of the substrate lower portion holding mechanism 24, and to operate them in an interlocking manner.

The substrate unloading mechanism 27 is disposed in the vicinity of the standby position P8. The substrate unloading mechanism 27 has the same constitution as that of the substrate loading mechanism 21. In FIGS. 4 to 6, the constituents (including the unloading position UP) of the substrate unloading mechanism 27 corresponding to the constituents (including the loading position LP) of the substrate loading mechanism 21 are indicated by the parenthesized signs.

The substrate unloading mechanism 27 includes a substrate upper portion holding mechanism 25 and a substrate lower portion holding mechanism 26. The substrate upper portion holding mechanism 25 includes a raising and lowering member 25a, a clamping member 25b, and a raising and lowering mechanism 25c. The substrate lower portion holding mechanism 26 includes a raising and lowering member 26a, a clamping member 26b, and a raising and lowering mechanism 26c. Since the positional relationship, the function, and the like of the respective constituents of the substrate unloading mechanism 27 are the same as those of the corresponding constituents of the substrate loading mechanism 21, the description thereof will be omitted.

The substrate carrying mechanisms SC are provided at two positions with the coating mechanism CT interposed therebetween in the X direction so as to be located at the center in the Y direction of the substrate processing unit SPU. Among the substrate carrying mechanisms SC at two positions, a device disposed on the −X direction side of the coating mechanism CT is a loading carrying mechanism SC1, and a device disposed on the +X direction side of the coating mechanism CT is an unloading carrying device SC2. The loading carrying mechanism SC1, the unloading carrying mechanism SC2, and the coating mechanism CT are arranged in a linear shape in the X direction.

Figure 7:
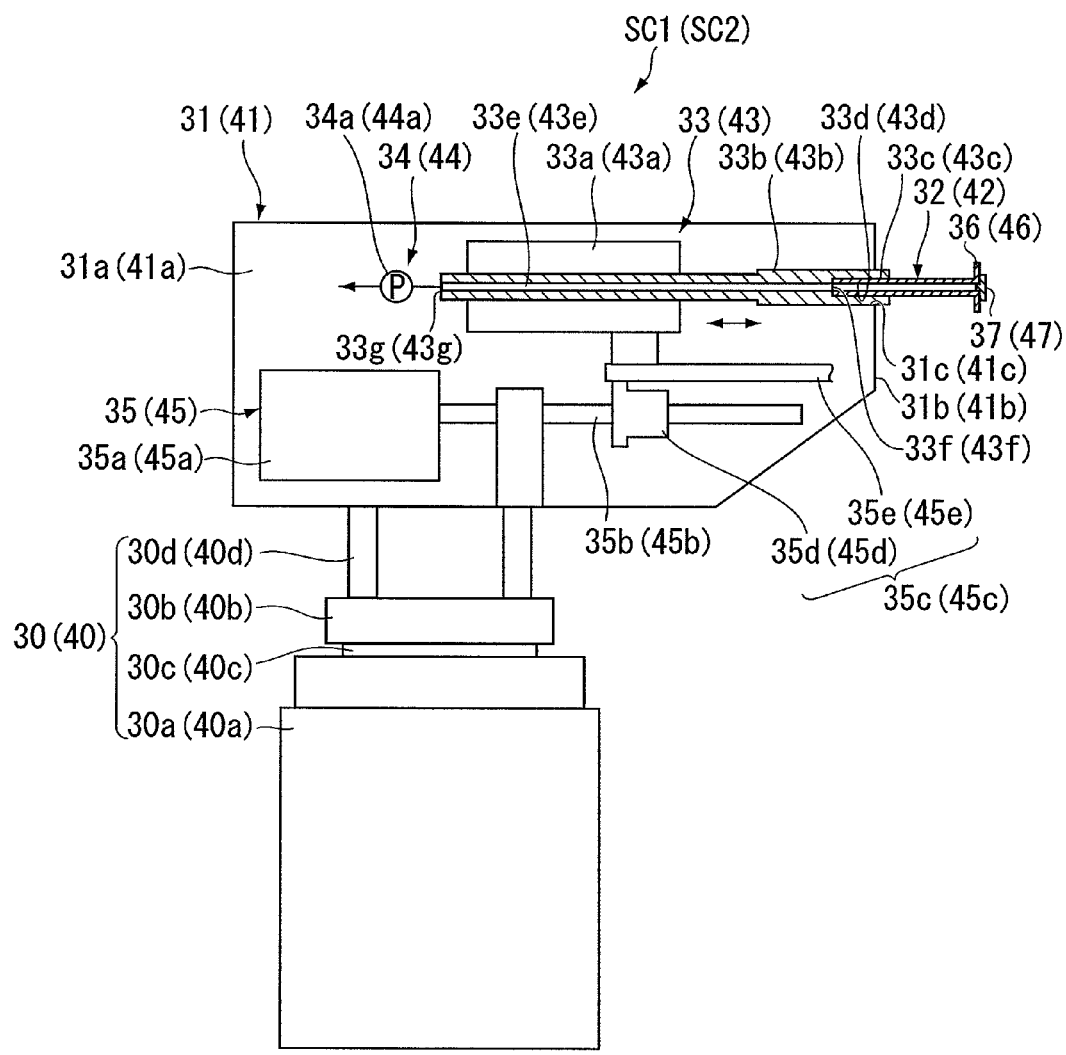
FIG. 7 is a view showing a constitution of the holding portion.

The loading carrying mechanism SC1 accesses the coating mechanism CT and the loading position LP of the loading buffer mechanism BF1 so as to carry the substrate S therebetween, FIG. 7 is a schematic view showing a constitution of the loading carrying device. As shown in FIG. 7, the loading carrying mechanism SC1 includes a base portion 30, an arm portion 31, and a holding portion 32.

The base portion 30 is provided on the upper surface of the recessed portion of the stage unit STU. The base 30 includes a fixed table 30a, a rotary table 30b, a rotary mechanism 30c, and support members 30d.

The fixed table 30a is fixed to the upper surface of the recessed portion of the stage unit STU. The base portion 30 is fixed onto the stage unit STU through the fixed table 30a so that no positional deviation occurs. The rotary table 30b is disposed on the fixed table 30a through the rotary mechanism 30c. The rotary table 30b is adapted to be rotatable about the Z axis serving as the rotary axis relative to the fixed table 30a. The rotary mechanism 30c is a driving mechanism which is provided between the fixed table 30a and the rotary table 30b, and applies the rotation force to the rotary table 30b. Each of the support members 30d is a column member of which the −Z direction side end portion is fixed onto the rotary table 30b. The support members 30d are provided at a plurality of positions, for example, two positions of the rotary table 30b. The +Z direction side end portion of the support member 30d is inserted into the arm portion 31.

The arm portion 31 is supported by the support members 30d of the base portion 30. The arm portion 31 moves the holding portion 32 to different positions inside the substrate processing unit SPU. The arm portion 31 includes a casing 31a formed in a pentagonal column. A front end surface 31b of the casing 31a is provided with an opening 31c. A rotary mechanism 33, a suction mechanism 34, and a moving mechanism 35 are provided inside the casing 31a.

The rotary mechanism 33 is disposed on the +Z direction side inside the casing 31a. The rotary mechanism 33 includes a motor device 33a and a rotary shaft member 33b. The motor device 33a and the rotary shaft member 33b are adapted to be movable together in the horizontal direction in the drawing. The motor device 33a is a driving device which applies the rotation force to the rotary shaft member 33b. The rotary shaft member 33b is a bar-shaped member which has a circular section and is disposed in parallel to the XY plane.

The rotary shaft member 33b is adapted to be rotatable about the center of the circle serving as the rotary axis by the driving force of the motor device 33a. The rotary shaft member 33b is disposed so that one end thereof protrudes from the opening 31c to the outside of the casing 31a (protrusion 33c). The end surface of the rotary shaft member 33b on the side of the protrusion 33c is provided with a concave portion 33d used for mounting the holding portion 32 thereto. The concave portion 33d is formed in a circular shape in sectional view. The protrusion 33c includes a fixing mechanism which fixes the holding portion 32 in the state where the holding portion 32 is mounted to the concave portion 33d. Since the holding portion 32 is fixed by the fixing mechanism, the rotary shaft member 33b and the holding portion 32 are adapted to be movable together.

The rotary shaft member 33b includes a perforation hole 33e. The perforation hole 33e is formed so as to perforate a range from a bottom surface 33f of the concave portion 33d of the rotary shaft member 33b to an end surface 33g on the other side of the rotary shaft member 33b. The bottom surface 33f of the concave portion 33d of the rotary shaft member 33b communicates with the end surface 33g through the perforation hole 33e.

The suction mechanism 34 is provided in the end surface 33g of the rotary shaft member 33b. The suctioning means 34 includes a suctioning device such as a suction pump 34a. The suction pump 34a is connected to the perforation hole 33e of the end surface 33g of the rotary shaft member 33b. The suction pump 34a suctions the perforation hole 33e from the end surface 33g of the rotary shaft member 33b, thereby suctioning the holding portion 32 disposed on the bottom surface 33f of the concave portion 33d communicating with the perforation hole 33e.

The moving mechanism 35 is disposed on the −Z direction side inside the casing 31a. The moving mechanism 35 includes a motor device 35a, a rotary shaft member 35b, and a movable member 35c. The motor device 35a is a driving device which applies the rotation force to the rotary shaft member 35b. The rotary shaft member 35b is a bar-shaped member which has a circular section and of which one end is inserted in the motor device 35a. The rotary shaft member 35b is adapted to be rotatable about the center of the circle serving as the rotary axis by the motor device 35a. A screw thread (not shown) is formed on the surface of the rotary shaft member 35b.

The movable member 35c includes a screw-connection portion 35d and a connection portion 35e. The screw-connection portion 35d is integrally formed with the rotary shaft member 35b, and has a screw thread (not shown) formed on the surface thereof. The connection portion 35e is fixed to, for example, the motor device 33a of the rotary mechanism 33. A screw thread is formed on the lower surface of the connection member 35e, and adapted to mesh with the screw thread formed in the screw-connection portion 35d.

When the motor device 35a rotates the rotary shaft member 35b, the rotary shaft member 35b and the screw-connection portion 35d are adapted to rotate together. By rotation of the screw-connection portion 35d, the connection member 35e meshing with the screw thread of the screw-connection portion 35d is adapted to move in the left or right direction in the drawing, and the connection member 35e and the fixing mechanism 33 fixed to the connection member 35e are adapted to move together in the left or right direction in the drawing. By means of the movement, the holding portion 32 provided in the right end of the rotary mechanism 33 in the drawing is adapted to move in the horizontal direction in the drawing.

The holding portion 32 is separably fixed to the concave portion 33d of the arm portion 31. The holding portion 32 holds, for example, the substrate S by using the holding force such as the absorption force. The holding portion 32 includes a suction member 36 and a blocking member 37. The suction member 36 and the blocking member 37 are separably provided.

The loading carrying mechanism SC1 with the above-described constitution allows the holding portion 32 to access both the coating mechanism CT and the loading position LP in such a manner that the arm portion 31 rotates about the Z axis serving as the rotary axis or moves in the XY plane. The loading carrying mechanism SC1 can hold the substrate S by the suctioning force of the suction pump 34a in the arm portion 31 so as to be upright in the Z direction, and it is possible to rotate the substrate S so as to be upright in the Z direction by rotating the rotary shaft member 33b in the arm portion 31. The state where the substrate is upright in the Z direction refers to the state where the substrate S is inclined with respect to a horizontal plane. In the embodiment, it is preferable to rotate by holding in the state where the substrate is upright at an angle equal to or more than 70° and equal to or less than 90° with respect to a horizontal plane. The rotary shaft members disposed in the arm portion 31 for rotating the substrate may have a constitution in which plural shaft members are connected through couplings.

Returning to FIGS. 1 to 3, the unloading carrying mechanism SC2 accesses the coating mechanism CT, the unloading position UP of the unloading buffer mechanism BF2, and the peripheral edge removing mechanism EBR so as to carry the substrate S therebetween. The unloading carrying mechanism SC2 includes a base portion 40 (a fixed table 40a and a rotary table 40b), an arm portion 41, and a holding portion 42. Since the constitution of the unloading carrying mechanism SC2 is the same as that of the loading carrying mechanism SC1, the description of the respective constituents will be omitted. In FIG. 7, the constituents of the unloading carrying mechanism SC2 corresponding to the constituents of the loading carrying mechanism SC1 are indicated by the parenthesized signs. Hereinafter, when mentioning the constituents of the unloading carrying mechanism SC2, the names of the corresponding constituents of the loading carrying mechanism SC1 are used, and the parenthesized signs in FIG. 7 are respectively added to the names.

Figure 8:
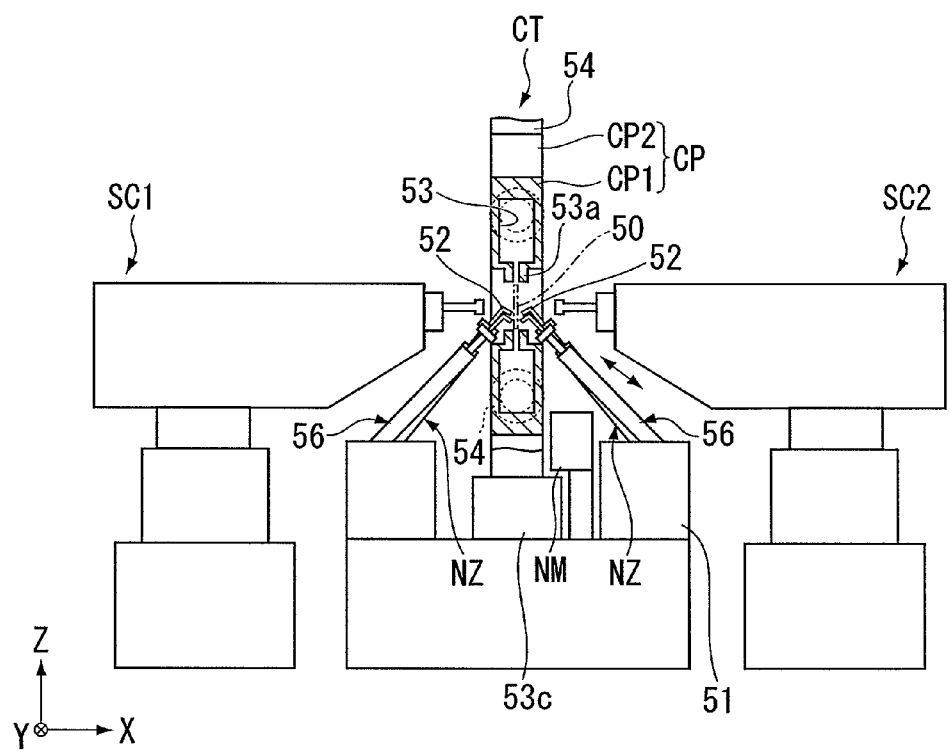
FIG. 8 is a front view showing a constitution of the substrate processing unit.
Figure 9:
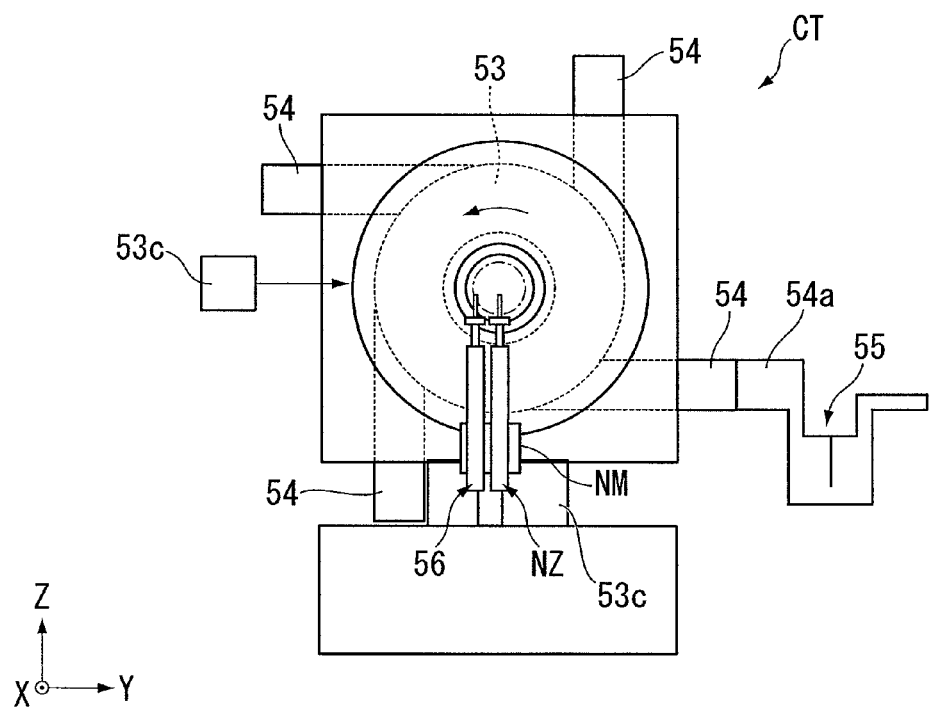
FIG. 9 is a side view showing the constitution of the substrate processing unit.
Figure 10:
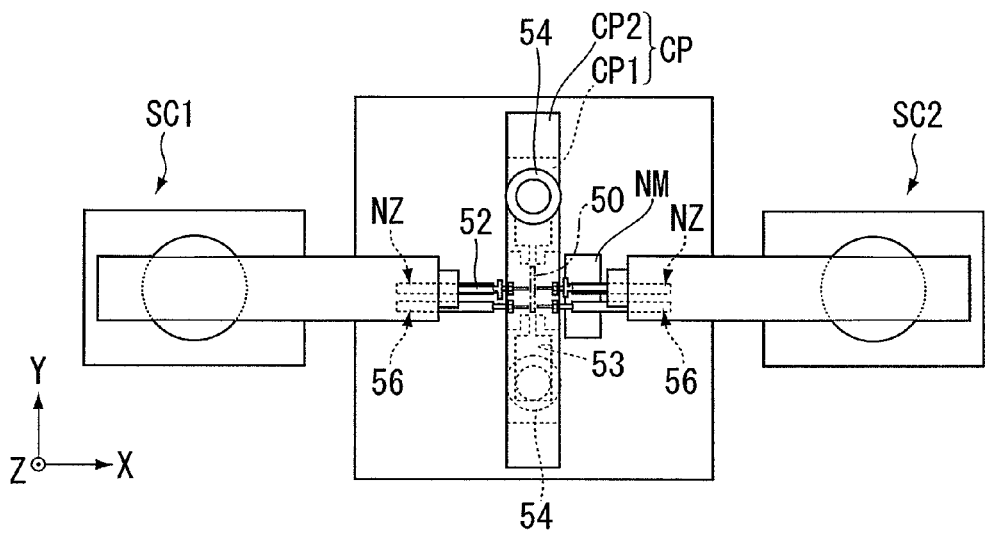
FIG. 10 is a plan view showing the constitution of the substrate processing unit.

The coating mechanism CT is substantially disposed at the center of the substrate processing unit SPU in plan view, and is fixed to the upper surface of the recessed portion of the stage unit STU. The coating mechanism CT is a device which coats a liquid material on the substrate S so as to form a thin film thereon. In the embodiment, the coating mechanism CT forms a thin film, used to perform an imprinting process, on the substrate S. The access to the coating device CT is possible from both the −X direction side and +X direction side of the coating mechanism CT. Accordingly, for example, the loading operation and the unloading operation of the substrate S are possible from both the −X direction side and the +X direction side. The coating device CT is configured to perform a coating process at a coating position (a position depicted by the dashed line in the drawing) 50 substantially positioned in the center of the STU unit in the X direction. FIGS. 8 to 10 are views showing a constitution of the coating mechanism CT. The coating mechanism CT includes a nozzle portion NZ, a cup portion CP, and a nozzle managing mechanism NM.

Figure 11:
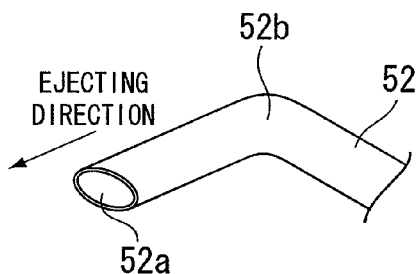
FIG. 11 is a view showing a constitution of a front end of a nozzle.

The nozzle portions NZ are provided so as to access the center in the Y direction of the coating position 50 by using the nozzle moving mechanism 51. The nozzle portions NZ are respectively disposed on the +X direction side and the −X direction side of the coating position 50. Each nozzle portion NZ includes the nozzle 52 which ejects the liquid material as a material forming the thin film onto the substrate S. The nozzle 52 is formed by bending at the bent portion 52b (FIG. 11) so as to eject the liquid material from the center of the substrate S to the outer periphery thereof when the nozzle access the coating position. The nozzle 52 is provided on the −Z direction side of the rotary axis of the substrate S. The nozzles 52 are disposed at the same positions of the front surface (+X direction side) and the rear surface (−X direction side) of the substrate S relative to the coating position 50 so as to be symmetric to each other in the X direction. As shown in FIG. 11, the ejecting surface 52a of the front end of the nozzle 52 is inclined relative to the ejecting direction of the liquid material. Since the front end of the nozzle 52 is sharp, for example, it is possible for the liquid material to neatly run out from the nozzle upon stopping the coating operation using the liquid material.

The cup portion CP includes the inner cup CP1 and the outer cup CP2. The inner cup CP1 is formed in a circular shape when viewed in the X direction, and is disposed so as to surround the side portion of the substrate S disposed at the coating position 50. The outer cup CP2 is formed in a square shape when viewed in the X direction, and supports the outside portion of the inner cup CP1. The outer cup CP2 is fixed to the upper surface of the stage unit STU through, for example, a support member or the like. In the embodiment, the inner cup CP1 and the outer cup CP2 are integrally formed with each other, but may, of course, be separated from each other.

The inner cup CP1 includes an accommodation portion 53 which accommodates the liquid material. The accommodation portion 53 is provided with the discharging mechanism 54 which discharges at least one of the liquid material and gas inside the accommodation portion 53. The discharging mechanism 54 is provided along the tangential direction of the outer periphery of the inner cup CP1 formed in a circular shape. The discharging mechanism 54 is connected to the accommodation portion 53 of the inner cup CP1 through the outer cup CP2. As shown in FIG. 9, for example, the discharging mechanism 54 is provided in each of four edges of the outer cup CP2, where the number of discharging mechanisms 54 is four in total. As shown in FIG. 9, each discharging mechanism 54 is connected to each discharge path. Each discharge path is provided with the trap mechanism 55 which is a gas-liquid separating mechanism for separating a gas and a liquid. In addition, the discharge path and the trap mechanism 55 for other discharge mechanisms 54 shown in FIGS. 8 to 10 are not shown in the drawing.

Figure 12:
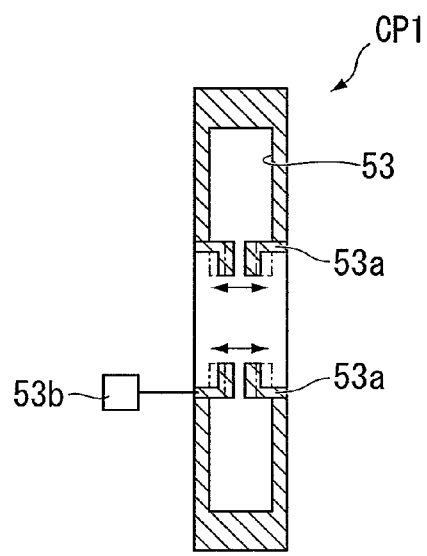
FIG. 12 is a view showing a constitution of an inner cup.

As the inlet of the accommodation portion 53, the facing portion 53a of the inner cup CP1 facing the side portion of the substrate S is separably mounted to other portions of the inner cup CP1. As shown in FIG. 12, the inner cup CP1 includes the adjusting mechanism 53b which adjusts the dimension of the opening of the facing portion 53a. For example, it is possible to adjust the dimension of the opening by using the adjusting mechanism 53b in accordance with the thickness of the substrate S or the bouncing state of the coating liquid. As shown in FIG. 9, the inner cup CP1 is provided with the rotary mechanism (second rotary mechanism) 53c which rotates the inner cup CP1 about the X axis serving as the rotary axis in a direction along the outer periphery of the substrate S. The −Y direction side portion of the nozzle 52 is provided with the cleaning liquid nozzle portion 56 which ejects the cleaning liquid of the cup portion CP to the substrate S.

Figure 13:
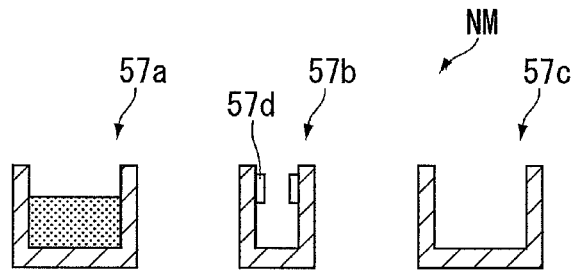
FIG. 13 is a view showing a constitution of a nozzle managing mechanism.

The nozzle managing mechanism NM manages the nozzle 52 so that the ejecting state thereof is uniform. As shown in FIG. 13, the nozzle managing mechanism NM includes the cleaning portion 57a, the suction portion 57b, and the liquid receiving portion 57c. The cleaning portion 57a cleans the front end of the nozzle 52 by dipping the front end in the solution. The suction portion 57b includes the suction pads 57d which suction the front end of the nozzle 52. The suction pads 57d are connected to a suction pump (not shown) or the like. The liquid receiving portion 57c is a portion which receives the liquid material preliminarily ejected from the nozzle 52.

The peripheral edge removing mechanism EBR is provided at a position on the +X direction side of the coating mechanism CT along the −Y direction side edge of the substrate processing unit SPU. The peripheral edge removing mechanism EBR is a device which removes the thin film formed on the peripheral edge of the substrate S. It is desirable that a removing process using the peripheral edge removing mechanism EBR be performed in a state where the thin film formed on the substrate S is not dried. For this reason, it is desirable that the peripheral edge removing mechanism EBR be disposed at a position capable of carrying the substrate S from the coating mechanism CT in a short time.

Figure 14:
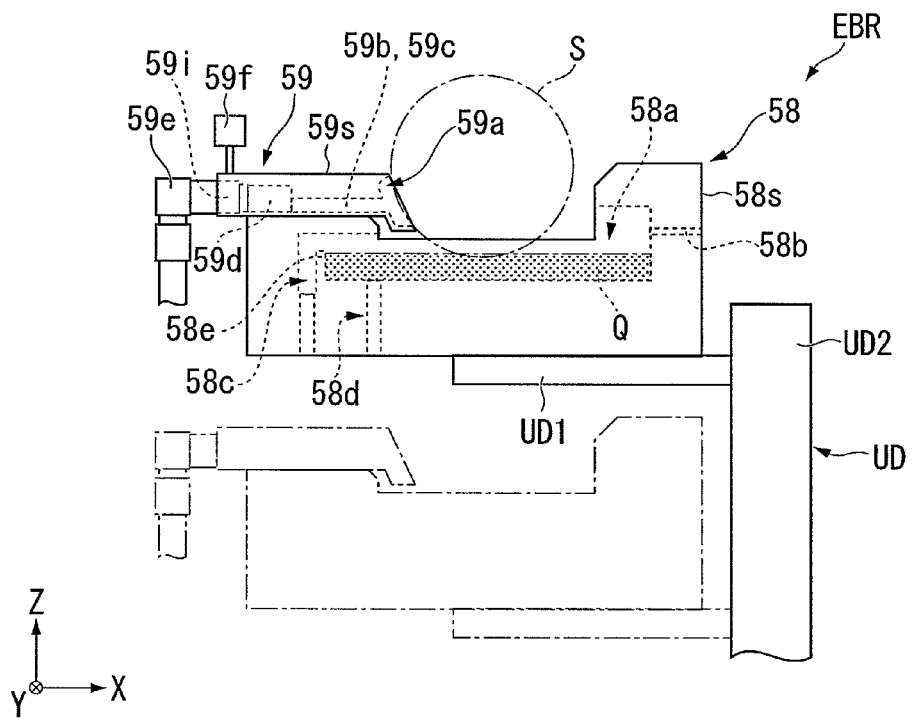
FIG. 14 is a view showing a constitution of a peripheral edge removing mechanism.
Figure 15:
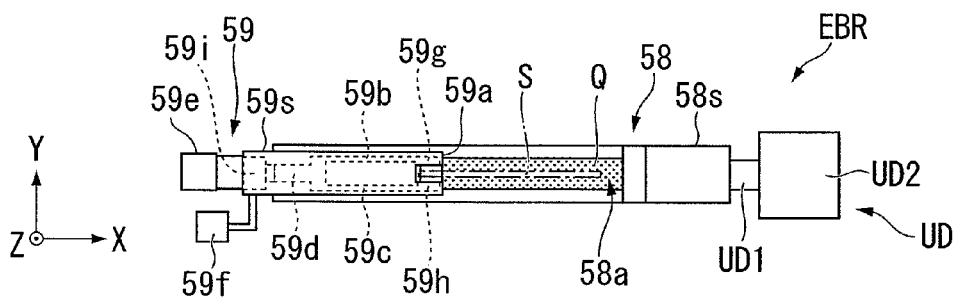
FIG. 15 is a view showing the constitution of the peripheral edge removing mechanism.

FIG. 14 is a side view showing a constitution of a peripheral edge removing mechanism EBR. FIG. 15 is a top view showing the constitution of the peripheral edge removing mechanism EBR.

The peripheral edge removing mechanism EBR includes, as shown in FIGS. 14 and 15, a dip portion 58, a suction portion 59, and a raising and lowering mechanism UD.

The dip portion 58 is, for example, a portion which removes the thin film formed on the peripheral edge of the substrate S in such a manner that the peripheral edge of the substrate S is dipped in the solution by rotating the substrate S so as to dissolve and remove the thin film formed on the peripheral edge of the substrate S. The dip portion 58 includes a casing 58s, a solution holding portion 58a, a solution supplying portion 58b, a solution discharging portion 58c, and a liquid level adjusting portion 58d.

The solution holding portion 58a is a portion which holds a solution Q by storing the solution Q. The solution holding portion 58a is a concave portion formed in a casing 58s. The solution holding portion 58a is, as show in FIG. 15, formed so that the size in the Y direction is more than the thickness of the substrate S, and can accommodate the substrate S.

The solution holding portion 58a has enough depth (size in the Z direction) to dip the substrate S therein. In the casing 58s, a wall portion 58e defining the maximum holding amount of the solution Q is formed. When an amount more than the maximum holding amount Q of the solution Q is supplied, the liquid level Qa of the solution Q becomes higher than the wall portion 58e, and thus the solution Q spills over the wall portion 58e and flows out into the solution discharging portion 58c.

The solution supplying portion 58b is, for example, a portion which is connected to the +X side of the solution holding portion 58a, and supplies the solution Q to the solution holding portion 58a. The solution supplying portion 58b is a perforation hole formed at the +X side wall portion of the casing 58s. The solution supplying portion 58b is connected to a solution supply source (not shown). The solution supply source is provided with a supply drive source (not shown) and can adjust the supply amount of the solution Q using the supply drive source. The solution supplying portion 58b is provided up to the +Z side of the level (position on the Z axis) at the upper portion of the wall portion 58e. The position of the solution supplying portion 58b is not limited thereto and, for example, the solution supplying portion may be provided up to the −Z side of the level at the upper portion of the wall portion 58e. With the constitution, when a new solution is added in the state where the solution Q is held by the solution holding portion 58a, a new solution is supplied to the inside of the held solution Q, thus making it possible to prevent the liquid level of the solution Q from waving.

The solution discharging portion 58c is, for example, a portion which is connected to the −X side of the solution holding portion 58a, and discharges the solution Q in the solution holding portion 58a. The solution discharging portion 58c is a hole portion formed so as to pass through the bottom portion of the casing 58s. The solution discharging portion 58e is connected to the solution holding portion 58a through the space formed on the +Z side of the wall portion 58e. The solution discharging portion 58c is, for example, connected to a suction mechanism such as a suction pump. It is possible to adjust the discharge amount of the solution Q by controlling the suction amount of the suction mechanism.

The liquid level adjusting portion 58d is provided on the bottom portion of the solution holding portion 58a. The liquid level adjusting portion 58d is a perforation hole which penetrates through the bottom portion of the casing 58s. The liquid level adjusting portion 58d is connected to the suction mechanism (not shown). Use of the suction mechanism enables discharge the solution Q bit by bit from the bottom portion of the solution holding portion 58a. The liquid level adjusting portion 58d is formed so that the hole diameter thereof is smaller than that of the solution discharging portion 58c. The liquid level adjusting portion 58d is formed on the portion which deviates from the contact portion between the substrate S and the solution Q of the solution holding portion 58a. In the embodiment, the liquid level adjusting portion is disposed at the position on the solution discharging portion 58c side of the contact portion of the solution holding portion 58a.

The suction portion 59 is a portion which suctions the peripheral edge of the substrate S after dipping in the solution Q of the dip portion 58. The suction portion 59 is disposed on the casing 58s of the dip portion 58. The suction portion 59 includes a casing 59s, an interposing portion 59a, flow paths 59b and 59c, a confluent flow path 59d, a suction connection tube 59e, and a moving portion 59f.

The interposing portion 59a is a portion which interposes the substrate S from the front and rear surfaces. The interposing portion 59a is a notch portion formed at the +X side end of the casing 59s. The interposing portion 59a is disposed so that the position at the center thereof in the Y direction and the position at the center in the Y direction of the solution supplying portion 58a overlap in the Z direction view. Therefore, the substrate S can be simultaneously interposed between the interposing portion 59a in the state of being dipped in the solution Q. The +X side end surface of the interposing portion 59a is formed so as to incline in the direction separating from the substrate S with respect to the Z direction in Y direction view.

In the interposing portion 59a, openings 59g, 59h facing each of the front and rear surfaces of the substrate S are formed. The openings 59g, 59h are suction ports which suction the front and rear surfaces of the substrate S. The opening 59g faces, for example, toward the −Y direction side, while the opening 59h faces toward the +Y direction side. The interposing portion 59a is formed so that the size in the Y direction becomes larger than that in the thickness direction of the substrate S so as to form a gap between the openings 59g, 59h and the front and rear surfaces of the substrate S in the state where the substrate S is interposed.

The flow path 59b is connected to the opening 59g. The flow path 59b is formed from the opening 59g to the +Y direction side in the casing 59s, and is also formed so as to fold back to the −X side in the vicinity of the +Y direction side end portion of the casing 59s. Since the flow path 59b is formed in the Y direction in the vicinity of the opening 59g, the substrate S is suctioned in the direction which is perpendicular to the substrate surface direction.

The confluent flow path 59d is a portion formed by confluence of the flow path 59b and the flow path 59c. The confluent flow path 59d is a hole portion formed so as to pass the casing 59s through the −X side. The suction connection tube 59e is connected to the confluent flow path 59d through an insertion portion 59i. The suction connection tube 59e is connected to a suction mechanism (not shown) such as, for example, a suction pump.

The moving portion 59f is, for example, an actuator which moves the casing 59s in the X direction. It is possible to adjust the interposing depth to the substrate S by moving the casing 59s using the moving portion 59f. The interposing depth can be used, for example, as the size in the X direction at the portion where the substrate S and the interposing portion 59a overlap in the Y direction view.

The raising and lowering mechanism UD includes a moving member UD1 and a driving portion UD2. The moving member UD1 is fixed to the casing 58s of the dip portion 58, and is provided movably in the Z direction. The driving portion UD2 includes, for example, a drive source such as an air cylinder or a linear motor, and applies a driving force in the Z direction to the moving member UD1. The casing 58s fixed to the moving member UD1 moves together by the movement of the moving member UD1 in the Z direction, while the dip portion 58 and the suction portion 59 move together by the movement of the casing 58s.

Substrate Unloading Unit

Returning to FIGS. 1 to 3, the substrate unloading unit ULU is disposed on the +X direction side of the substrate processing unit SPU in the substrate processing system SYS. The substrate unloading unit ULU is a unit which collects the unloading cassette C2 accommodating the processed substrate S and receives the empty unloading cassette C2. The substrate unloading unit ULU is elongated in the Y direction, and is capable of accommodating plural unloading cassettes C2 arranged in the Y direction.

The substrate unloading unit ULU includes a cassette entrance 60 and a cassette moving mechanism (second moving mechanism) 61. The cassette entrance 60 is an opening which is provided on the −Y direction side of the cover member covering the substrate unloading unit ULU. The cassette entrance 60 is an inlet (supply opening) for the empty unloading cassette C2, and an outlet (collection opening) for the unloading cassette C2 accommodating the processed substrate S.

The cassette moving mechanism 61 includes, for example, a driving mechanism such as a belt conveyor mechanism. In the embodiment, as the driving mechanism, conveyor belts are provided. The conveyor belts extend in the Y direction from the +Y direction side end portion of the substrate unloading unit ULU to the −Y direction side end portion thereof, where two conveyor belts are arranged in the X direction.

Among the two conveyor belts, the supply belt 61a is a conveyor belt which is disposed on the −X direction side. The +Z direction side surface of the supply belt 61a is used as a conveyor surface. The supply belt 61a is adapted to rotate so that the conveyor surface moves in the +Y direction. Plural unloading cassettes C2, which enter the substrate unloading unit ULU through the cassette entrance 60, are placed on the conveyor surface of the supply belt 61a. The unloading cassettes C2 are moved to the carrying unit CRU by the rotation of the supply belt 61a.

Among the two conveyor belts, the collection belt 61b is a conveyor belt which is disposed on the +X direction side. The +Z direction side surface of the collection belt 61b is used as a conveyor surface. The collection belt 61b is adapted to rotate so that the conveyor surface moves in the −Y direction. Plural unloading cassettes C2 accommodating the processed substrates S are placed on the conveyor surface of the collection belt 61b. The unloading cassettes C2 are allowed to move to the cassette entrance 60 by the rotation of the collection belt 61b.

In the embodiment, for example, the unloading cassettes C2 are capable of staying in a standby state at standby positions (container standby portion) provided at five positions on the supply belt 61a and the collection belt 61b. In the substrate unloading unit ULU, it is possible to move the standby position of the unloading cassette C2 by rotating the supply belt 61a and the collection belt 61b. It is possible to shorten the carrying time of the unloading cassette C2 by moving the standby position.

Carrying Unit

The carrying unit CRU is disposed in an area along the +Y direction side edge inside the substrate processing system SYS, and is disposed so as to be adjacent to the substrate processing unit SPU, the substrate loading unit LDU, and the substrate unloading with ULU. The carrying unit CRU carries the loading cassette C1 between the substrate processing unit SPU and the substrate loading unit LDU, and carries the unloading cassette C2 between the substrate processing unit SPU and the substrate unloading unit ULU. The carrying unit CRU includes a rail mechanism RL and a cassette carrying device CC.

The rail mechanism RL is fixed onto the stage unit STU, and extends in a linear shape in the X direction from the −X-direction-side end portion of the carrying unit CRU to the +X-direction-side end portion thereof. The rail mechanism RL is a guiding mechanism which guides the moving position of the cassette carrying device CC. The rail mechanism RL includes two rail members 70 which are parallel in the Y direction.

The cassette carrying device CC is provided on two rail members 70 so as to be suspended on the two rail members 70 in plan view. The cassette carrying device CC is a carrying device which accesses the buffer mechanism BF of the substrate processing unit SPU, the substrate loading unit LDU, and the substrate unloading unit ULU, and holds and carries the loading cassette C1 and the unloading cassette C2. The cassette carrying device CC includes a movable member 71, a cassette support plate 72, a support plate rotating mechanism 73, a cassette holding member 74, a holding member raising and lowering mechanism 75, and a holding member sliding mechanism 76.

The movable member 71 is formed in an H-shape in plan view, and includes concave portions 71a which are respectively fitted to two rail members 70. The movable member 71 includes therein, for example, a driving mechanism (a motor mechanism or the like) which is not shown in the drawing. The movable member 71 is adapted to be movable in a linear area along the rail members 70 by the driving force of the driving mechanism.

The cassette support plate 72 is a plate-shaped member which is fixed to the movable member 71 and is formed in a rectangular shape in plan view. The cassette support plate 72 is formed to have a dimension larger than that of the bottom portion of each of the loading cassette C1 and the unloading cassette C2, and is capable of stably placing the loading cassette C1 and the unloading cassette C2 thereon. Since the cassette support plate 72 is fixed to the movable member 71, the cassette support plate 72 moves together with the movable member 71.

The support plate rotating mechanism 73 is a rotary mechanism which rotates the cassette support plate 72 in the XY plane where the Z axis serves as the rotary axis. The support plate rotating mechanism 73 is capable of changing the longitudinal direction of each of the loading cassette C1 and the unloading cassette C2 placed on the cassette carrying device CC by rotating the cassette support plate 72.

The cassette holding member 74 is a holding member which is disposed on the +Y direction side of the cassette support plate 72 in plan view and is formed in a U-shape in plan view. The cassette holding member 74 is provided so that the X-direction position thereof overlaps with the cassette support plate 72. The cassette holding member 74 is supported on the movable member 71 through a support member (not shown), and is movable together with the movable member 71. Both end portions, formed in a U-shape, of the cassette holding member 74 are formed as a holding portion 74a which engages with the engagement portion Cx provided in each of the loading cassette C1 and the unloading cassette C2. A gap of the holding portion 74a (both end portions formed in a U-shape) in the X direction is adjustable in accordance with a gap of the engagement portion Cx provided in each of the loading cassette C1 and the unloading cassette C2. The cassette holding member 74 is capable of further reliably holding the loading cassette C1 and the unloading cassette C2 in the Z direction in such a manner that the holding portion 74a engages with the engagement portion, Cx.

The holding member raising and lowering mechanism 75 is a moving mechanism which is provided in the cassette holding member 74 and moves the cassette holding member 74 in the Z direction. As the holding member raising and lowering mechanism 75, for example, a driving mechanism such as an air cylinder may be used. When the cassette holding member 74 moves in the +Z direction by using the holding member raising and lowering mechanism 75, it is possible to lift the loading cassette C1 and the unloading cassette C2 held by the cassette holding member 74. On the contrary, when the cassette holding member 74 moves in the −Z direction by using the holding member raising and lowering mechanism 75, it is possible to place the lifted cassette on a desired position.

The holding member sliding mechanism 76 is a moving mechanism which is provided in the cassette holding member 74, and moves the cassette holding member 74 in the Y direction. The holding member sliding mechanism 76 includes a guide bar 76a which extends in the Y direction and a movable member 76b which moves along the guide bar 76a. The movable member 76b is fixed to the cassette holding member 74. When the movable member 76b moves in the Y direction along the guide bar 76a, the cassette holding member 74 moves together with the movable member 76b in the Y direction.

Control Unit

The control unit CNU is provided in the stage unit STU of the substrate processing system SYS. The control unit CNU includes, for example, a control device which controls all operations in the respective units and a material supply source which supplies a material required for each unit, where all operations include a substrate processing operation in the substrate processing unit SPU, a cassette moving operation in the substrate loading unit LDU or the substrate unloading unit ULU, a carrying operation in the carrying unit CRU, and the like. The material supply source may be exemplified by, for example, a liquid material supply source, a cleaning liquid supply source, or the like.

Next, an operation of the substrate processing system SYS having the above-described constitution will be described. The operations performed by the respective units of the substrate processing system SYS are controlled by the control unit CNU. In the below description, the unit performing the operation is mainly described, but actually, the operation is performed on the basis of the control of the control unit CNU.

Cassette Supply Operation

First, the cassette supply operation in which the loading cassette C1 accommodating the unprocessed substrate S is disposed in the substrate loading unit LDU, and the empty unloading cassette C2 is disposed in the substrate unloading unit ULU will be described.

For example, by a supply device (not shown) or the like, the loading cassette C1 accommodating the unprocessed substrate S is supplied to the substrate loading unit LDU through the cassette entrance 10. The substrate loading unit LDU allows the loading cassettes C1 to sequentially supply while rotating the supply belt 11a. By this operation, plural loading cassettes C1 accommodating the unprocessed substrates S are arranged inside the substrate loading unit LDU.

On the other hand, for example, by a supply device (not shown) or the like, the empty unloading cassette C2 is supplied to the substrate unloading unit ULU through the cassette entrance 60. The substrate unloading unit ULU allows the unloading cassettes C1 to sequentially supply while rotating the supply belt 11a. By this operation, plural unloading cassettes C2 accommodating the unprocessed substrates S are arranged inside the substrate unloading unit ULU.

Cassette Carrying Operation

Next, the cassette carrying operation in which the loading cassette C1 supplied to the substrate loading unit LDU and the unloading cassette C2 supplied to the substrate unloading unit ULU are respectively supplied to the substrate processing unit SPU will be described. This cassette carrying operation is performed by using the cassette carrying device CC provided in the carrying unit CRU.

The operation of carrying the loading cassette C1 will be described. The carrying unit CRU allows the cassette carrying device CC to access the substrate loading unit LDU, and transfers the loading cassettes C1 and moves the cassette carrying device CC up to the loading buffer mechanism BF1. The carrying unit CRU moves the cassette carrying device CC, and places the loading cassettes C1 to the standby position P1 of the loading buffer mechanism BF1. After the transfer operation, the substrate loading unit LDU moves the supply belt 11a, and moves the rest of the loading cassettes C1 together in the +Y direction. According to the movement of the loading cassettes C1, the space on the −Y direction side on the supply belt 11a becomes empty. Accordingly, a new loading cassette C1 is supplied to the empty space by a supply mechanism (not shown).

The operation of carrying the unloading cassette C2 is performed in the same manner. That is, the carrying unit CRU allows the cassette carrying device CC to access the substrate unloading unit ULU, and transfers the unloading cassettes C2 and moves the cassette carrying device CC up to the unloading buffer mechanism BF2. The carrying unit CRU moves the cassette carrying device CC, and places the unloading cassettes C2 to the standby position P5 of the unloading buffer mechanism BF2. After the transfer operation, the substrate unloading unit ULU moves the supply belt 61a, and moves the rest of the unloading cassettes C2 together in the +Y direction. According to the movement of the unloading cassettes C2, the space on the −Y direction side on the supply belt 61a becomes empty. Accordingly, a new unloading cassette C2 is supplied to the empty space by a supply mechanism (not shown).

Substrate Processing Operation

Next, a processing operation of the substrate processing unit SPU will be described.

The substrate processing unit SPU performs a moving operation of moving the loading cassette C1 accommodating the unprocessed substrate S and the empty unloading cassette C2, a loading operation of loading the substrate S accommodated in the loading cassette C1, a coating operation of coating a liquid material on the substrate S, a peripheral edge removing operation of removing the peripheral edge of the thin film formed on the substrate S, an unloading operation of unloading the processed substrate S, a moving operation of moving the empty loading cassette C1 and the unloading cassette C2 accommodating the processed substrate S, a maintenance operation of a nozzle portion NZ, and a maintenance operation of a cup portion CP, respectively. In addition to the respective operations, the carrying operation of carrying the substrate S is performed between the loading operation and the coating operation, between the coating operation and the peripheral edge removing operation, and between the shape forming operation and the unloading operation.

Among these operations, first, the moving operation of the loading cassette C1 and the unloading cassette C2 will be described. The substrate processing unit SPU moves the loading cassette C1 carried to the standby position P1 of the loading buffer mechanism BF1 to the standby position P2 by using the conveyor belt 20a, and further moves the loading cassette C1 moved to the standby position P2 to the standby position P4 by using the conveyor belt 20b. In the same manner, the substrate processing unit SPU moves the unloading cassette C2 carried to the standby position P5 of the unloading buffer mechanism BF2 to the standby position P6 by using the conveyor belt 22a, and further moves the unloading cassette C2 moved to the standby position P6 to the standby position P8 by using the conveyor belt 22b. According to these operations, the loading cassette C1 and the unloading cassette C2 carried to the substrate processing unit SPU are disposed at a process start position.

Next, the loading operation of the substrate S will be described. After the substrate processing unit SPU checks that the loading cassette C1 is disposed at the standby position P4, the substrate processing unit SPU disposes the substrate upper portion holding mechanism 23 at the clamping position and moves the raising and lowering member 24a of the substrate lower portion holding mechanism 24 in the +Z direction. According to the movement, the clamping member 24b mounted to the +Z direction side end portion of the raising and lowering member 24a comes into contact with the direction side portion of one sheet of substrate S disposed on the farthest –Y direction side among the substrate S accommodated in the loading cassette C1, and the –Z direction side portion of the substrate S is held by the clamping member 24b.

After the –Z direction side portion of the substrate S is held, the substrate processing unit SPU moves further the raising and lowering member 24a in the +Z direction in the held state of the substrate S. According to the movement, the substrate S is lifted in the +Z direction side by the substrate lower portion holding mechanism 24, the +Z direction side portion of the substrate S comes into contact with the clamping member 23b of the substrate upper portion holding mechanism 23, and then the +Z direction side portion of the substrate S is held by the clamping member 23b. The substrate S is held by both the clamping member 23b of the substrate upper portion holding portion 23 and the clamping member 24b of the substrate lower portion holding mechanism 24.

The substrate processing unit SPU simultaneously moves the raising and lowering members 23a and 24a in the +Z direction in the state where the substrate S is held by the clamping members 23b and 24b. The substrate processing unit SPU moves the raising and lowering mechanisms 23c and 24c in an interlocking manner so that the raising and lowering members 23a and 24a move at the same speed. The substrate S held by the clamping members 23b and 24b moves in the +Z direction. When the substrate S is disposed at the loading position LP, the substrate processing unit SPU stops the movement of the raising and lowering members 23a and 24a. In this manner, the loading operation of the substrate S is performed.

After the loading operation, the substrate processing unit SPU allows the holding portion 32 of the loading carrying mechanism SC1 to access the loading position LP, and allows the substrate S disposed at the loading position LP to be held by the holding portion 32. When the holding portion 32 accesses the loading position LP, the substrate processing unit SPU rotates the rotary table 30b so that the front end surface 31b of the arm portion 31 faces the +Y direction, and drives the motor device 35a so that the arm portion 31 moves in the Y direction. In accordance with the movement of the arm portion 31, the holding portion 32 mounted to the front end surface 31b of the arm portion 31 accesses the loading position LP.

After the access of the holding portion 32, the substrate processing unit SPU operates the suction pump 34a and the substrate S is held by absorbing to the holding portion 32. By means of the operation, the substrate S is held by the holding portion 32 so as to be upright in the Z direction. In the substrate processing unit SPU, after the substrate S is uprightly held by the holding portion 32, the holding force of the clamping members 23b and 24b is canceled so that the substrate S is held by only the holding portion 32. In this state, the substrate processing unit SPU withdraws the clamping members 23b and 24b, of which the holding force is canceled, in the –Z direction. After the clamping members 23b and 24b are withdrawn, the substrate processing unit SPU rotates the rotary table 30b of the loading carrying mechanism SC1, and carries the substrate S to a coating position inside the coating mechanism CT.

Next, the coating operation of coating the liquid material on the substrate S will be described. In the coating operation, the coating mechanism CT is used. The substrate processing unit SPU rotates the substrate S at a high speed in the state where the substrate is upright in the Z direction, allows nozzles 52 provided in the coating mechanism CT to access a coating position 50, and then ejects the liquid material from the nozzles 52 to the substrate S.

In detail, the substrate processing unit SPU operates the motor device 33a in the state where the substrate S is disposed at the coating position 50. When the rotary shaft member 33b rotates by the operation of the motor device 33a, the holding portion 32 supported to the rotary shaft member 33b rotates together with the rotary shaft member 33b. According to this operation, the substrate S rotates while the substrate S is upright in the Z direction.

After the substrate S rotates in the state where the substrate S is upright in the Z direction, the substrate processing unit SPU allows the nozzle 52 on the +X and –X direction sides of the coating position 50 to access the substrate S, and ejects the liquid material from the nozzle 52 to the front and rear surfaces of the substrate S. The ejected liquid material equally spreads to the outer periphery of the substrate S by the centrifugal force caused by the rotation, thereby forming a thin film on both surfaces of the substrate S.

Since the nozzles 52 are disposed on the –Z direction side of the rotary axis of the substrate S, the nozzles 52 are disposed without contacting with the holding portion 32 and the arm portion 31. In addition, since the nozzles 52 eject the liquid material from the rotary axis of the substrate S to the outer periphery of the substrate S, the movement of the liquid material toward the center of the substrate S is suppressed.

The substrate processing unit SPU rotates an inner cup CP1 upon coating the liquid material on the substrate S by rotating the substrate S. In the liquid material ejected onto the substrate S, due to the rotation of the substrate S, the liquid material protrudes and flows from the substrate S, and is accommodated in an accommodation portion 53 through an opening formed in a facing portion 53a of the inner cup CP1. In the inside of the accommodation portion 53, due to the rotation of the inner cup CP1, the stream of the liquid material and gas occurs in the rotation direction. In accordance with the stream, the liquid material and gas are discharged to a discharge path through a discharging mechanism 54 connected to an outer cup CP2. The liquid material and gas discharged to the discharge path are divided by a trap mechanism 55, so that the gas passes through the trap mechanism 55 and the liquid material remains in the trap mechanism 55. The liquid material remaining in the trap mechanism 55 is discharged through a discharge portion (not shown).

After the coating operation, the substrate processing unit SPU makes the holding portion 42 of the unloading carrying mechanism SC2 access the substrate S inside the coating mechanism CT from the +X direction, and the holding portion 42 holds the substrate S. The operation of holding the substrate S using the holding portion 42 is the same as that of the case where the substrate S is held by the holding portion 32. According to this operation, one surface of the substrate S is held by the holding portion 32 of the loading carrying mechanism SC1 and the other surface of the substrate S is held by the holding portion 42 of the unloading carrying mechanism SC2.

After the substrate S is held by the holding portion 42, the substrate processing unit SPU stops the operation of the suction pump 34a so as to cancel the holding operation using the holding portion 32. According to this operation, since the substrate S is held by only the holding portion 42 of the unloading carrying mechanism SC2, the substrate S is delivered from the loading carrying mechanism SC1 to the unloading carrying mechanism SC2.

Figure 16:
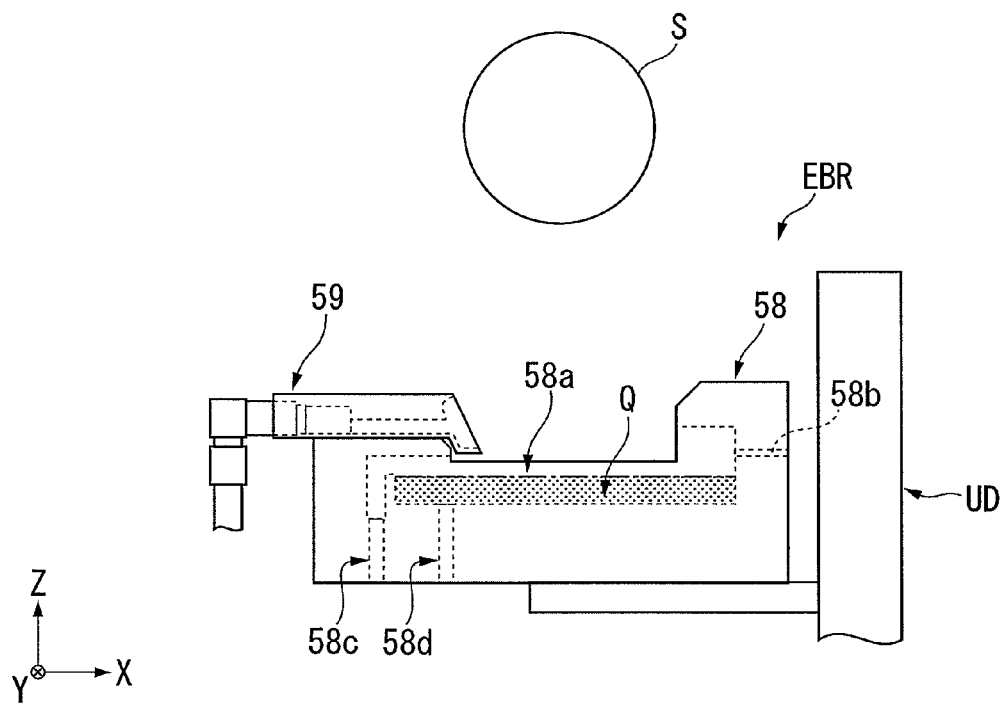
FIG. 16 is a view showing the behavior of the peripheral edge removing mechanism.

Next, the peripheral edge removing operation of removing the thin film formed in the periphery of the substrate S will be described. In the peripheral edge removing operation, the peripheral edge removing mechanism EBR is used. After the delivery operation of the substrate 5, the substrate processing unit SPU rotates a rotary table 40b of the unloading carrying mechanism SC2 and appropriately expands or contracts an arm portion 41 so that the substrate S is disposed on the +Z direction of the peripheral edge removing mechanism EBR, as shown in FIG. 16. At this time, the substrate processing unit SPU carries the substrate S by the unloading carrying mechanism SC2 so that the substrate S is disposed at the center in the Y direction of the solution holding portion 58a.

Figure 17:
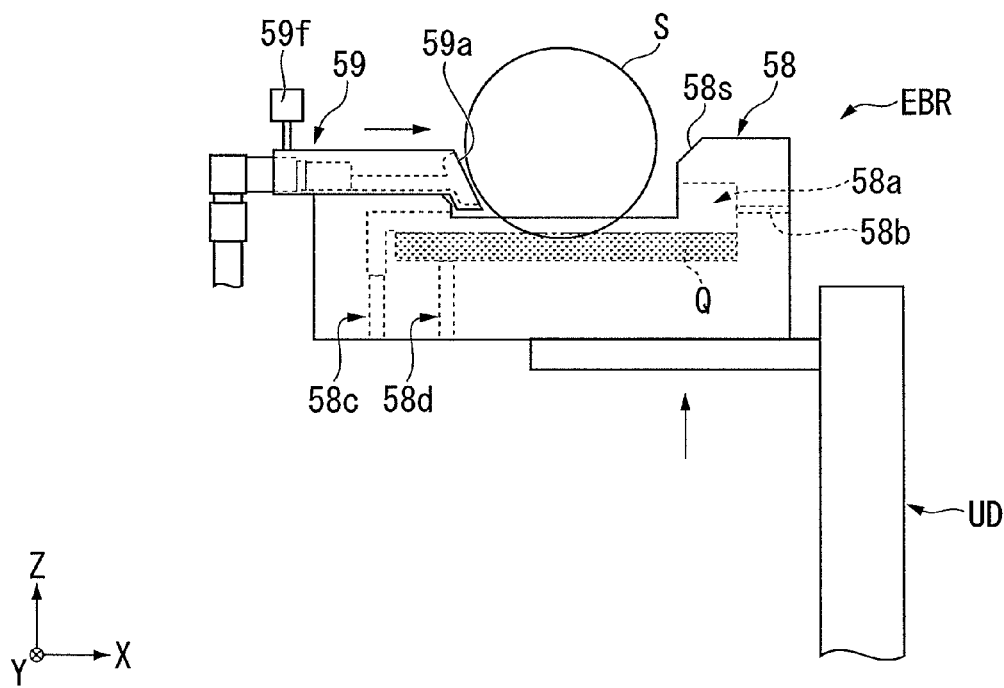
FIG. 17 is a view showing the behavior of the peripheral edge removing mechanism.

After disposing the substrate S on the solution holding portion 58a, the substrate processing unit SPU moves the dip portion 58 and the suction portion 59 to the +Z side using the raising and lowering mechanism UD and allows the substrate S to dip in the solution Q, as shown in FIG. 17. Simultaneously, the substrate processing unit SPU brings the casing 59s of the suction portion 59 close to the side of the substrate S side using the moving portion 59f, thereby interposing the substrate S into the interposing portion 59a.

Figure 18:
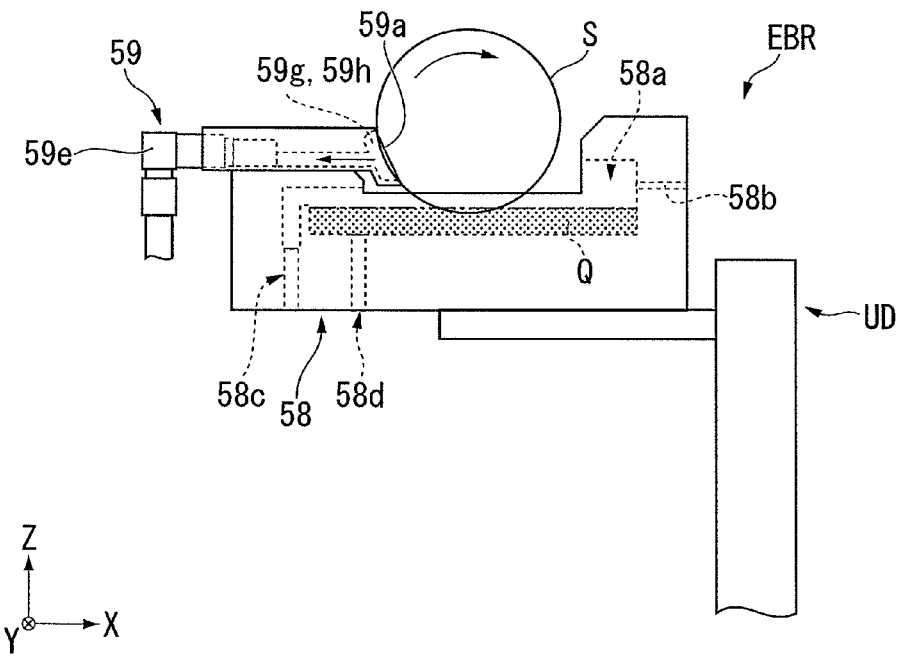
FIG. 18 is a view showing the behavior of the peripheral edge removing mechanism.

The substrate processing unit SPU operates a motor device 43a of an unloading carrying mechanism SC2 after adjusting the interposing depth of the substrate S by the moving portion 59f, and also operates a suction mechanism (not shown) connected to the suction connection tube 59e of the suction portion 59 as shown in FIG. 18. The rotary shaft member 43b rotates by an action of the motor device 43a, and the suction member 46 held by the rotary shaft member 43b rotates together with the rotary shaft member 43b. The thin film of the peripheral edge of the substrate S is removed by the rotation. The portion where the thin film has been removed along the peripheral edge of the substrate S moves into the interposing portion 59a of the suction portion 59 by rotation of the substrate S, and is then suctioned by the openings 59g, 59h. The liquid material and solution Q remaining at the peripheral edge of the substrate S are removed by the suctioning operation.

Figure 19:
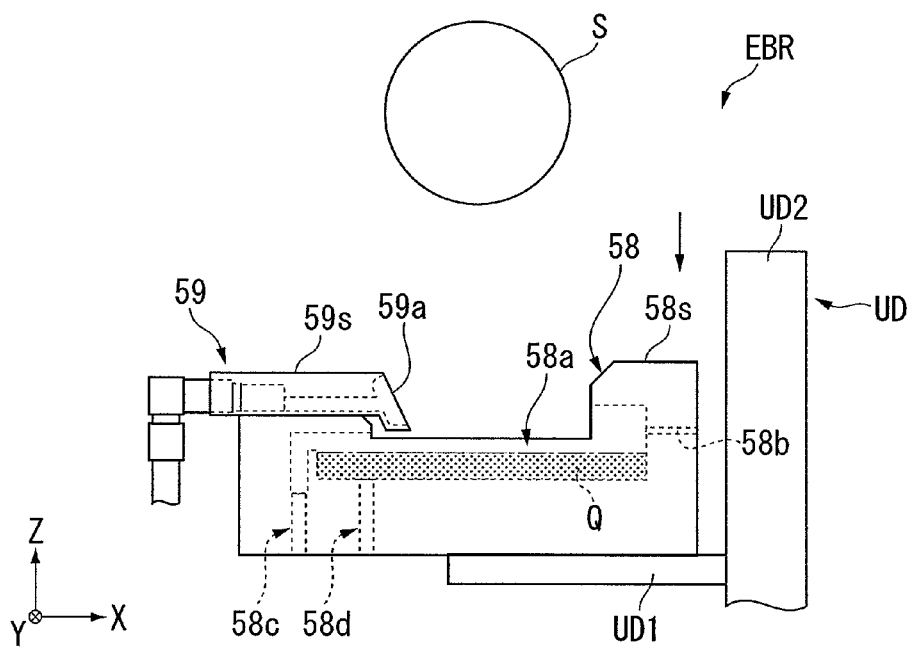
FIG. 19 is a view showing the behavior of the peripheral edge removing mechanism.

After rotating the substrate S for a predetermined amount of time, the substrate processing unit SPU stops the rotation of the substrate S, and stops the suctioning operation by the suction portion 59. The substrate processing unit SPU stops these operations, moves the dip portion 58 and the suction portion 59 to the −Z side using the raising and lowering mechanism UD as shown in FIG. 19, and then cancels the dipping of the substrate S. In such a manner, the peripheral edge removing operation is performed.

As the peripheral edge removing operation is repeated, the residue of the liquid material is accumulated in the solution Q. In this case, for example, when the substrate S is dipped in the solution Q, the residue may adhere to the substrate S and the dissolution ability of the solution Q may deteriorate. In order to deal therewith, the substrate processing unit SPU discharges the solution Q in the solution holding portion 58a using a suction mechanism (not shown) connected to the solution discharging portion 58c of the dip portion 58. In this operation, the solution Q in the solution holding portion 58a can be discharged at a time by momentarily generating a suctioning force by the suction mechanism.

After the discharging operation of the solution Q, the substrate processing unit SPU supplies the solution Q from the solution supplying portion 58b to the solution holding portion 58a. After supplying a predetermined amount of the solution Q to the solution holding portion 58a, the substrate processing unit SPU stops the supplying operation of the solution Q. After stopping the supplying operation, the substrate processing unit SPU discharges the solution Q bit by bit from the liquid level adjusting portion 58d using the suction mechanism connected to the liquid level adjusting portion 58d, thereby adjusting the liquid level the position (Z coordinate) so as to dispose the liquid level of the solution Q to the predetermined position.

After adjusting the liquid level position, the substrate processing unit SPU optionally performs the peripheral edge removing operation, as the need arises. In such a manner, the substrate processing unit SPU performs the peripheral edge removing operation while appropriately replacing the liquid material Q in the liquid material holding portion 58a. Therefore, the peripheral edge removing operation is performed without adhesion of the residue of the liquid material to the substrate S while maintaining the dissolution ability of the solution Q.

After the peripheral edge removing operation, the substrate processing unit SPU moves the raising and lowering member 25a so that the clamping member 25b of the substrate upper portion holding mechanism 25 is located on the +Z direction side of the unloading position UP. After the movement of the raising and lowering member 25a, the substrate processing unit SPU rotates the rotary table 40b in the state where the substrate S is held by the holding portion 42 of the unloading carrying mechanism SC2, and appropriately expands or contracts the arm portion 41 so that the holding portion 42 accesses the unloading position UP. According to this operation, the substrate S is disposed at the unloading position UP.

Next, the unloading operation of the substrate S will be described. After the substrate processing unit SPU checks that the substrate S is disposed at the unloading position UP, the substrate processing unit SPU moves the raising and lowering member 25a of the substrate upper portion holding mechanism 25 in the −Z direction and the raising and lowering member 26a of the substrate lower portion holding mechanism 26 in the +Z direction. According to this movement, the clamping member 25b mounted to the −Z direction side portion of the raising and lowering member 25a comes into contact with the +Z direction side portion of the substrate S, and the clamping member 26b mounted to the +Z direction side end portion of the raising and lowering member 26a comes into contact with the −Z direction side portion of the substrate S so that the +Z direction side portion and the −Z direction side portion of the substrate S are respectively held by the clamping members 25b and 26b.

After the substrate processing unit SPU checks that the substrate S is held by both the clamping members 25b and 26b, the substrate processing unit SPU stops the operation of the suction pump 44a of the unloading carrying mechanism SC2 so as to cancel the operation of holding the substrate S using the holding portion 42. According to this operation, the substrate S is held by only the clamping members 25b and 26b. The substrate processing unit SPU simultaneously moves the raising and lowering members 25a and 26a in the −Z direction in the state where the substrate S is held by the clamping members 25b and 26b. The substrate processing unit SPU moves the raising and lowering mechanisms 25c and 26c in an interlocking manner so that the raising and lowering members 25a and 26a move at the same speed. The substrate S is moved in the −Z direction in the state where the substrate S is held by the clamping members 25b and 26b.

When the protrusion of the raising and lowering member 25a approaches the unloading cassette C2, the substrate processing unit SPU cancels the holding force using the clamping member 25b and stops the movement of the raising and lowering member 25a so that only the raising and lowering member 26a moves in the −Z direction. The substrate S is moved in the −Z direction in the state where the substrate S is held by the holding force using the clamping member 26b.

The substrate processing unit SPU maintains the operation of holding the substrate S using the clamping member 26b until the substrate S arrives at the accommodation position inside the unloading cassette C2. After the substrate S arrives at the accommodation position, the substrate processing unit SPU cancels the holding operation using the clamping member 26b, and moves the raising and lowering member 26a in the −Z direction. According to this operation, the substrate S is accommodated in the unloading cassette C2.

In the description of the respective operations, the respective operations are sequentially performed on one sheet of substrate S accommodated on the farthest −Y direction side of the loading cassette C1, but actually, the respective operations are continuously performed on plural substrates S. In this case, the substrate processing unit SPU rotates the conveyor belt 20b and moves the loading cassette C1 in the −Y direction so that the substrate S disposed on the farthest −Y direction side of the rest of the substrates S accommodated in the loading cassette C1 is disposed at a position overlapping with the loading position LP in plan view.

In the same manner, the substrate processing unit SPU rotates the conveyor belt 22b and moves the unloading cassette C2 in the −Y direction so that the accommodation position on the farthest −Y direction side of the accommodation positions inside the unloading cassette C2 is disposed at a position overlapping with the unloading position UP in plan view. When the substrate processing unit SPU moves the loading cassette C1 and the unloading cassette C2, the substrate processing unit SPU repeats the above-described operations.

In the case where plural substrates S are processed, the substrate processing unit SPU simultaneously performs the processing operations on the plural substrates S. In detail, during the time when the coating operation is performed on a certain substrate S, the peripheral edge removing operation is performed on the other substrate S. In addition, the loading operation or the unloading operation is performed on another substrate S. In this manner, the operations are simultaneously performed on the plural substrates S. Thus, since the process operations are simultaneously performed, the standby time of the substrate S is reduced as much as possible, and hence the process takt time of the substrate S is reduced.

In the case where the processes of all the substrates S accommodated in the loading cassette C1 end, the loading cassette C1 is empty, and all accommodation positions of the unloading cassette C2 staying at the standby position P8 are filled with the processed substrates S. After the substrate processing unit SPU checks this state, the substrate processing unit SPU moves the loading cassette C1 from the standby position P4 to the standby position P2 by rotating the conveyor belt 20b in the inverse direction, and moves the loading cassette C1 to the standby position P3 by rotating the conveyor belt 20a. In the same manner, the substrate processing unit SPU moves the unloading cassette C2 from the standby position P8 to the standby position P6 by rotating the conveyor belt 22b in the inverse direction, and moves the unloading cassette C2 to the standby position P7 by rotating the conveyor belt 22a.

Next, a maintenance operation of a nozzle portion NZ and a cup portion CP of the coating mechanism CT will be described. When the coating operation is repeated, solidified materials such as a liquid material or impurities such as chips or dust in the atmosphere may be adhered to the nozzle portion NZ or the cup portion CP. The impurities may block, for example, the nozzles 52 to thereby deteriorate the ejecting characteristic thereof or may block the discharge path inside the cup portion CP. In addition, in the ejecting operation, it is necessary to constantly manage the ejecting condition of the nozzles 52. Accordingly, it is necessary to periodically perform the maintenance operation of the nozzle portion NZ and the cup portion CP.

In the maintenance operation of the nozzle portion NZ, a nozzle managing mechanism NM is used. Upon cleaning the nozzles 52, the substrate processing unit SPU moves the nozzle portion NZ so that the nozzle managing mechanism NM accesses the nozzles 52. The substrate processing unit SPU cleans the front end of each nozzle 52 by moving the front end of the nozzles 52 in the cleaning liquid of a cleaning portion 57a.

After the cleaning operation, the substrate processing unit SPU moves the front end of the nozzle 52 to a gap between the suction pads 57d of the suction portion 57b, and suctions the front end of the nozzle 52. According to the suctioning operation, impurities such as the cleaning liquid remaining in the nozzle 52 are removed.

After the suctioning operation, the substrate processing unit SPU moves the front end of the nozzle 52 to the inside of a liquid receiving portion 57c. In the liquid receiving portion 57c, a preliminary ejecting operation of the nozzle 52 is performed. By preliminarily discharging the liquid material from the nozzle 52, the ejecting condition of the nozzle 52 is adjusted. After the substrate processing unit SPU moves the front end of the nozzle 52 to the inside of the liquid receiving portion 57c, the substrate processing unit SPU ejects the liquid material from the nozzle 52. The ejected liquid material is collected in the liquid receiving portion 57c, and is collected by a collecting mechanism (not shown).

The maintenance operation of the cup portion CP will be described. Upon cleaning the cup portion CP, cleaning liquid nozzle portions 56 are used. Upon performing the coating operation, the substrate processing unit SPU allows the cleaning liquid nozzle portions 56 instead of the nozzles 52 to access the +X-direction-side portion and the −X-direction-side portion of the substrate S while the substrate S rotates, and ejects the cleaning liquid from the cleaning liquid nozzle portions 56 to the substrate S. The cleaning liquid ejected onto the substrate S moves to the peripheral edge of the substrate S by the centrifugal force caused by the rotation, and flows from the peripheral edge of the substrate S to the inner cup CP1. The flying cleaning liquid is accommodated in the accommodation portion 53 through the opening of the facing portion 53a. At this time, in the substrate processing unit SPU, since the inner cup CPI rotates, it is possible to cause a stream of the cleaning liquid inside the accommodation portion 53. Accordingly, it is possible to clean the inside of the accommodation portion 53 and the inside of the discharge path by the stream of the cleaning liquid. As in the case of discharging the liquid material, the cleaning liquid is divided by the trap mechanism 55 so as to be discharged separately from a gas.

The cleaning operation of the cup portion CP may be performed, for example, in the state where the facing portion 53a of the accommodation portion 53 is separated. Even in the case where the cleaning operation is not performed, for example, the facing portion 53a may be separated so as to separately clean the facing portion 53a, or the facing portion 53a may be separated so as to perform the maintenance operation of other portions of the cup portion CP.

Cassette Carrying Operation

Next, the cassette carrying operation in which the empty loading cassette C1 is carried to the substrate loading unit LDU and the unloading cassette C2 accommodating the processed substrate S is carried to the substrate unloading unit ULU will be described.

The operation of carrying the loading cassette C1 will be described. The carrying operation is performed by using the cassette carrying device CC used in the above-described carrying operation. The carrying unit CRU moves the cassette carrying device CC up to the loading buffer mechanism BF1 of the substrate processing unit SPU, and allows the cassette carrying device CC to perform the transfer operation of the empty loading cassette C1 staying in a standby state at the standby position P3.

After the transfer operation of the loading cassette C1, the carrying unit CRU moves the cassette carrying device CC in the −X direction toward the substrate loading unit LDU. After the movement, the carrying unit CRU places the empty loading cassette C1 placed on the cassette support plate 72 on the +Y direction side end portion of the collection belt 11b, and withdraws the cassette holding member 74 in the +Y direction.

The operation of carrying the unloading cassette C2 will be described. The carrying operation is performed by using the cassette carrying device CC in the same manner as in the operation of carrying the loading cassette C1. The carrying unit CRU moves the cassette carrying device CC up to the unloading buffer mechanism BF2 of the substrate processing unit SPU in the X direction, and allows the cassette carrying device CC to perform the transfer operation of the empty unloading cassette C2 staying in a standby state at the standby position P7.

After the transfer operation, the carrying unit CRU moves the cassette carrying device CC in the −X direction toward the substrate unloading unit ULU. After the movement, the carrying unit CRU places the empty unloading cassette C2 placed on the cassette support plate 72 on the +Y direction side end portion of the collection belt 11b, and withdraws the cassette holding member 74 in the +Y direction.

Cassette Collecting Operation

Next, a cassette collecting operation of collecting the empty loading cassette C1 and the unloading cassette C2 accommodating the processed substrate S will be described.

After the substrate loading unit LDU checks that the empty loading cassette C1 is carried thereto, the substrate loading unit LDU rotates the collecting belt 11b so that the loading cassette C1 is carried to the outside of the substrate loading unit LDU through the cassette entrance 10. Whenever the loading cassette C1 is carried to the substrate loading unit LDU, this operation is repeated.

In the same manner, after the substrate unloading unit ULU checks that the unloading cassette C2 accommodating the processed substrate S is carried thereto, the substrate unloading unit ULU rotates the collecting belt 61b, so that the unloading cassette C2 is moved in the −Y direction and carried to the outside of the substrate unloading unit ULU through the cassette entrance 60. Whenever the unloading cassette C2 is carried to the substrate unloading unit ULU, this operation is repeated.

Cassette Supplement Operation

After the carrying unit CRU checks that the standby positions P1 and P5 are empty, the carrying unit CRU allows the cassette carrying device CC to carry the next loading cassette C1 and the unloading cassette C2 to the standby positions Pt and P5, respectively. The carrying unit CRU first moves the cassette carrying device CC up to the substrate loading unit LDU, and transfers the next loading cassette C1 thereto. After the transfer operation, the carrying unit CRU moves the cassette carrying device CC up to the loading buffer mechanism BF1, and places the transferred loading cassette C1 to the standby position P1. In the same manner, the carrying unit CRU moves the cassette carrying device CC to the substrate unloading unit ULU, and transfers the next unloading cassette C2 thereto. Then, the carrying unit CRU moves the cassette carrying device CC to the unloading buffer mechanism BF2, and places the unloading cassette C2 to the standby position P5.

When the loading cassette C1 moves from the standby position P1 to the standby position P2, and the unloading cassette C2 moves from the standby position P5 to the standby position P6, the standby positions P1 and P5 become empty again. The next loading caste C1 and the next unloading cassette C2 may stay at the empty standby positions P1 and P5, respectively. Thus, whenever the standby positions P1 and P5 of the loading buffer mechanism BF1 and the unloading buffer mechanism BF2 are empty, the carrying unit CRU carries the loading cassette C1 from the substrate loading unit LDU and carries the unloading cassette C2 from the substrate unloading unit ULU.

As described above, according to the embodiment, since the peripheral edge removing mechanism EBR which adjusts the coating state of the liquid material in the peripheral edge of the substrate S is provided, it becomes possible to improve the coating state of the peripheral edge of the substrate S. In addition, since the peripheral edge removing mechanism EBR includes the dip portion 58 which dips the outer periphery of the substrate S in the solution Q while rotating the substrate S and dissolves, and the suction portion 59 which suctions the vicinity of the outer periphery of the substrate S after dipping in the solution Q, it becomes possible to improve the coating state of the peripheral edge of the substrate S more reliably.

The technical scope of the invention is not limited to the above-described embodiment, but may be appropriately modified into various forms without departing from the spirit of the invention.

For example, the peripheral edge removing portion having the form which is different from that of the peripheral edge removing mechanism EBR may be provided in the coating device CT. In the case where the peripheral edge removing device is disposed inside the coating device CT, for example, a peripheral edge removing nozzle 56 having the same shape as that of the nozzle used for coating the liquid material may be separately disposed inside the coating device CT, and the solution of the liquid material may be ejected from the peripheral edge removing nozzle.

In addition, the solution nozzle may be commonly used with the cleaning liquid nozzle portion 56. In this case, the supply source of the solution is connected to the cleaning liquid nozzle portion 56, and one of the supply sources of the cleaning liquid and the solution is selected to eject the cleaning liquid or the solution, thereby ejecting both the cleaning liquid and the solution from the same cleaning liquid nozzle portion 56.

Figure 20A:
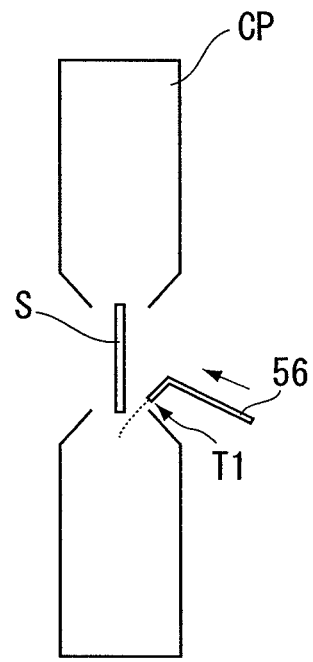
FIG. 20A and FIG. 20B are views showing a constitution of a cleaning liquid nozzle.
Figure 20B:
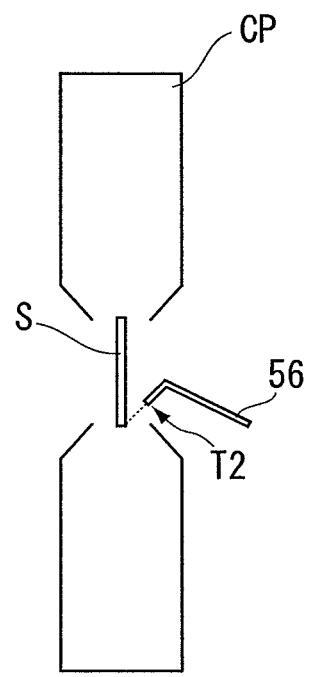

In the case where the solution is ejected from the cleaning liquid nozzle portion 56, for example, as shown in FIG. 20A, the control unit CNU ejects the solution from the cleaning liquid nozzle portion 56 at a position T1 where the solution does not contact with the substrate S. Subsequently, as shown in FIG. 20B, the control unit CNU moves the cleaning liquid nozzle portion 56 to a position T2 where the solution is ejected to the substrate S in the state where the solution is ejected, and ejects the solution to the peripheral edge of the substrate S at the ejecting position T2. According to these operations, it is possible to prevent the solution from flowing from the cleaning liquid nozzle portion 56 from flying to the center of the substrate S, and thus to improve the precision of adjusting the coating state of the outer periphery of the substrate S.

In the case where both of the peripheral edge removing mechanism EBR and the cleaning liquid nozzle 56 are provided, for example, it may be selected to use either of the two mechanisms by the control unit CNU in order to adjust the coating state of the peripheral edge of the substrate S is adjusted. Accordingly, it is possible to perform the adjusting operation of the coating state of the outer periphery of the substrate S by flexibly changing according to the coating situation and the carrying situation of the substrate S.

With the constitution wherein the peripheral edge removing portion is also provided in the coating device CT, the coating operation is performed in the state where the substrate S is held and rotated by each of the loading carrying device SC1 and the unloading carrying device SC2, and the peripheral edge removing operation is continuously performed after the coating operation. Accordingly, since the coating operation and the peripheral edge removing operation are performed by one device, it is possible to improve the efficiency of the process. In addition, since the coating operation and the peripheral edge removing operation are performed by one coating device CT, for example, after performing the coating operation and the peripheral edge removing operation on one sheet of substrate 5, the next substrate S to be processed can be loaded by the loading carrying device SC1 in the state where the one sheet of substrate S is unloaded by the unloading carrying device SC2. Since it is possible to simultaneously perform the loading operation using the loading carrying device SC1 and the unloading operation using the unloading carrying device SC2, it is possible to efficiently perform the process operation.

In the above-described embodiment, in the case of the peripheral edge removing operation, the substrate S was rotated using the unloading carrying mechanism SC2, but the invention is not limited thereto. For example, the peripheral edge removing mechanism EBR may originally have a mechanism of rotating by holding the substrate S. In this case, the substrate processing unit SPU can perform the peripheral edge removing operation by allowing the rotating mechanism provided in the peripheral edge removing mechanism EBR to hold the substrate S using the unloading carrying mechanism SC2, thereby rotating the rotating mechanism. With the constitution, since the unloading carrying mechanism SC2 can be used during the peripheral edge removing operation, it is possible to efficiently carry the substrate S and to reduce takt time as a result.

Figure 21:
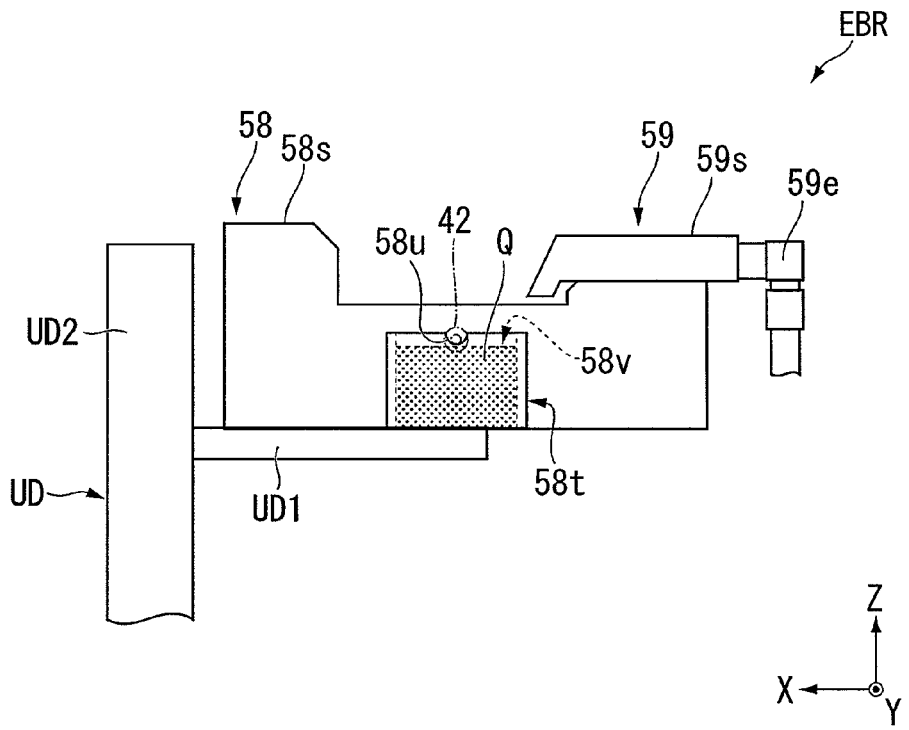
FIG. 21 is a view showing another constitution of the peripheral edge removing mechanism.
Figure 22:
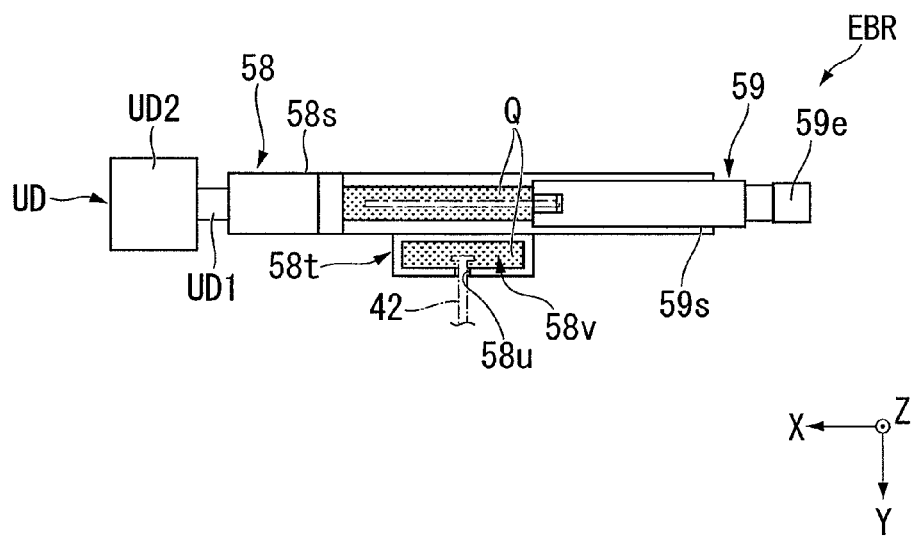
FIG. 22 is a view showing another constitution of the peripheral edge removing mechanism.

In the above-described embodiment, the peripheral edge removing mechanism EBR includes the dip portion 58 in which the peripheral edge of the substrate S is dipped. In addition, as shown in FIGS. 21 and 22, the peripheral edge removing mechanism EBR may include the second dip portion 58$t$ in which the holding portion 42 holding the substrate S is cleaned. Unlike the above-described the embodiment, FIGS. 21 and 22 show, as the standard, the state where the peripheral edge removing mechanism EBR is view from the +Y direction side to the −Y direction side. As shown in FIGS. 21 and 22, the second dip portion 58$t$ is mounted on the +Y direction side of the casing 58$s$ of the dip portion 58.

The second dip portion 58$t$ includes a concave portion 58$u$ and a solution storage portion 58$v$. The concave portion 58$u$ holds the axis portion of the holding portion 42. In the solution storage portion 58$v$, the solution which is the same as the solution Q in the above-described embodiment is stored. In the solution storage portion 58$v$, for example, the solution Q is supplied from a solution supplying portion (not shown) and the solution Q is discharged from a solution discharging portion (not shown). The supply source and the suction source of the solution Q in the above-described embodiment may be commonly used.

If the axis portion of the holding portion 42 is in the state where the axis portion is put on the concave portion 58$u$, the tip of the holding portion 42 is dipped in the solution Q. When the holding portion 42 is rotated in this state, the entire tip of the holding portion 42 is cleaned with the solution Q. In such a manner, the holding portion 42 can also be easily cleaned.

In the above-described embodiment, the cassette moving mechanisms 20, 22 are described as the belt conveyor mechanism in the loading buffer mechanism BF1 and the unloading buffer mechanism BF2, but the present invention is not limited thereto. For example, as shown in FIG. 23, the cassette C may be carried by the arm mechanism.

Figure 23:
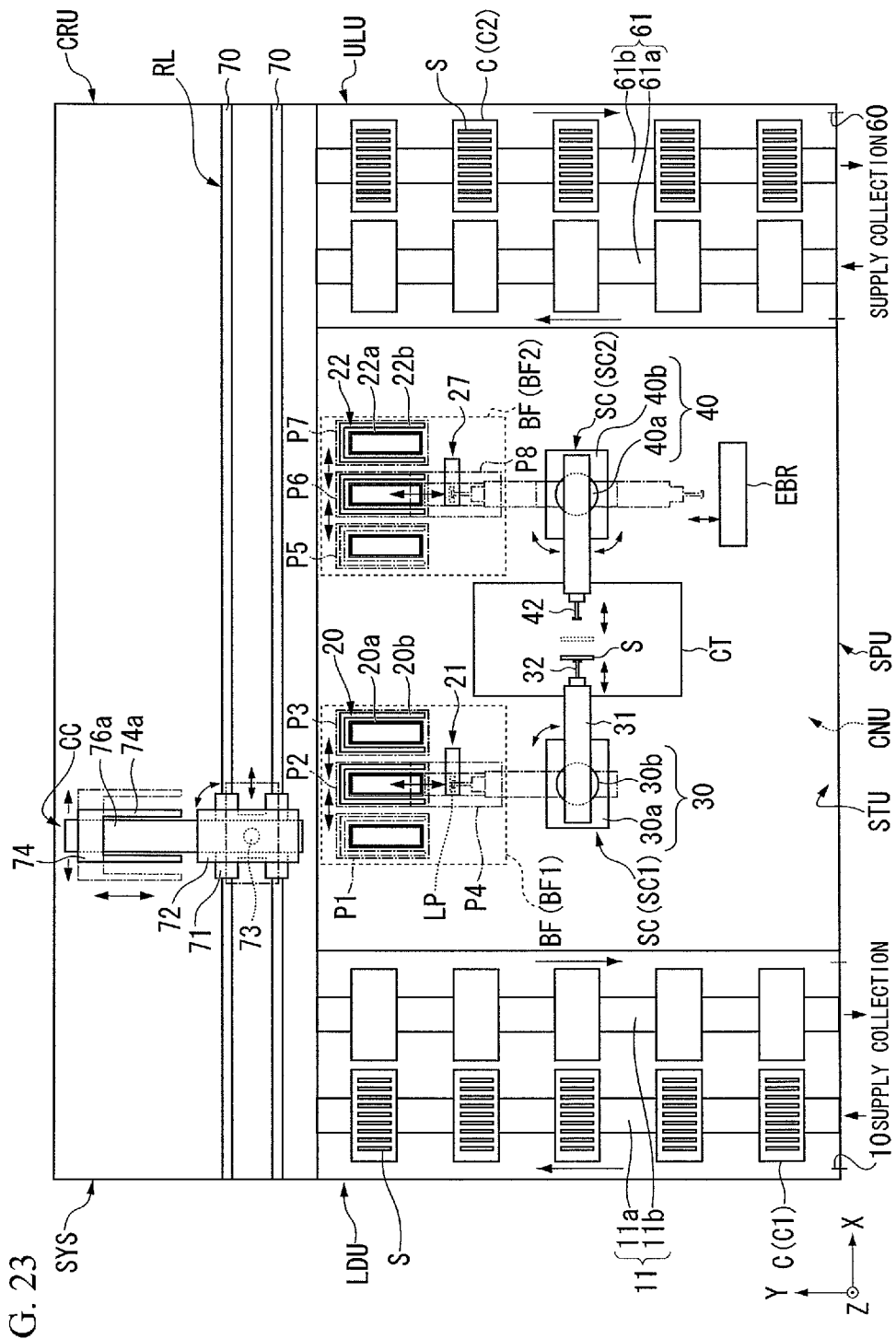
FIG. 23 is a view showing another constitution of a cassette moving mechanism.
Figure 24:
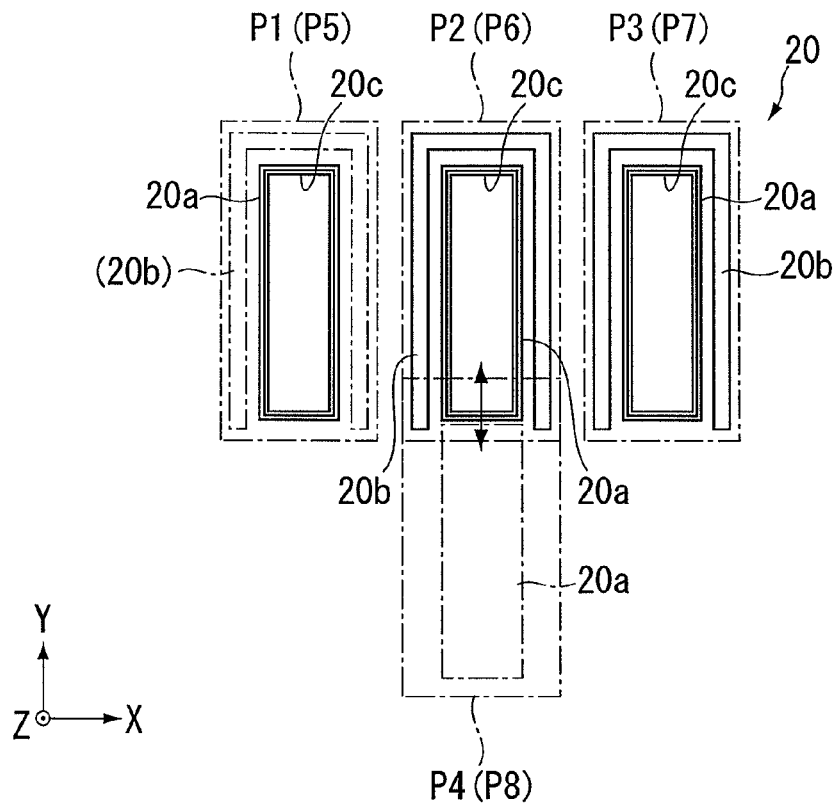
FIG. 24 is a view showing a partial constitution of the cassette moving mechanism.
Figure 25:
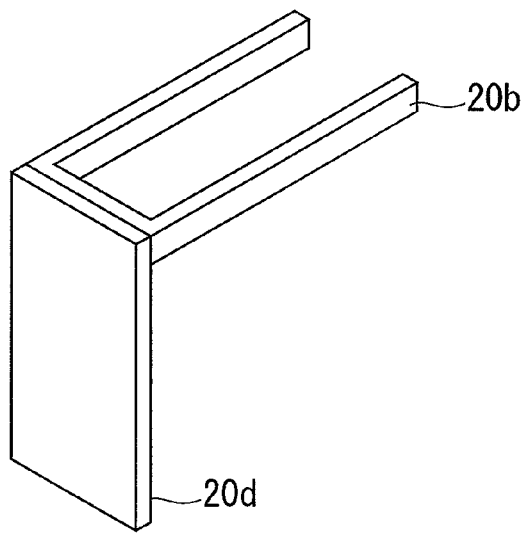
FIG. 25 is a view showing a partial constitution of the cassette moving mechanism.
Figure 26:
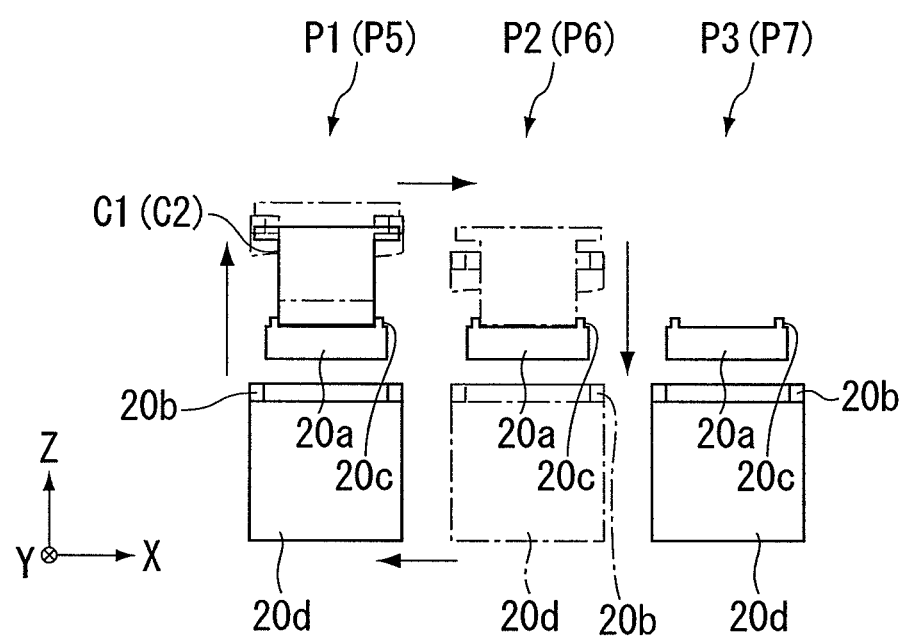
FIG. 26 is a view showing another constitution of the cassette moving mechanism.

FIG. 23 is a view which corresponds to FIG. 1 in the above-described embodiment and shows a constitution of cassette moving mechanisms 20, 22. FIG. 24 is an enlarged view of the cassette moving mechanism 20 of FIG. 23. FIG. 25 is a view showing a partial constitution of the cassette moving mechanism 20. FIG. 26 is a view showing the state when the cassette moving mechanism 20 is viewed in the +Y direction. Since the cassette moving mechanism 20 has the same constitution as that of the cassette moving mechanism 22, the description is mainly made by way of the cassette moving mechanism 20. FIGS. 24 and 26 show the standby positions P1 to P4 corresponding to the standby position P5 to P8.

As shown in FIGS. 23 to 26, the cassette moving mechanism 20 includes a cassette placing member 20$a$ and a cassette carrying arm 20$b$. The cassette placing member 20$a$ is a plate-shaped member provided respectively at the standby positions P1 to P3. On the +Z side surface of the cassette placing member 20$a$, a loading cassette C1 is placed.

As shown in FIGS. 23 and 24, the cassette placing member 20$a$ provided at the standby position P2 is movable in the Y direction by the driving portion (not shown). Therefore, the cassette placing member 20$a$ provided at the standby position P2 is removable between the standby position P2 and the standby position P4 by the driving portion. The cassette placing member 20$a$ provided at the standby positions P1 and P3 is in the fixed state.

As shown in FIGS. 24 and 26, on the +Z side surface (placing surface) of the cassette placing member 20a, the ring-shaped convex portion 20c is formed along the outer periphery of the loading cassette C1. By providing this convex portion 20c, the loading cassette C1 is fitted into the convex portion 20c in the state where the loading cassette C1 is placed on the cassette placing member 20a. Therefore, it becomes possible to perform positioning of the loading cassette C1 and to prevent the positional deviation of the loading cassette C1.

The cassette carrying arm 20b is provided at two positions of the standby positions P1 to P3. The cassette carrying arm 20b is formed along the outer periphery of the cassette placing member 20a in the Z direction view. The cassette carrying arm 20b is provided movably in the X and Z directions by the driving portion (not shown). As shown in FIG. 25, the cassette carrying arm 20b is in the state of being fixed and supported to the arm supporting member 20d. To the arm supporting member 20d, the driving mechanism (not shown) is connected. The driving mechanism (not shown) forms the arm supporting member 20d movably in the X and Z directions. The cassette carrying arm 20b is movable together with the movement of the arm supporting member 20d. As shown in FIG. 26, the cassette carrying arm 20b is provided movably on the +Z side and the −Z side of the cassette placing member 20a.

Next, an operation of the cassette moving mechanism 20 with the above-described constitution will be described. While the operation is mainly described by way of the cassette moving mechanism 20 in the following description of the operation, the similar operation is performed with respect to the cassette moving mechanism 22.

The substrate processing unit SPU moves the cassette carrying arm 20b from the −Z side to the +Z side of the cassette placing member 20a in the state where the loading cassette C1 is placed on the cassette placing member 20a provided at the standby position P1 using the driving mechanism (not shown) mounted to the arm supporting member 20d. By this operation, the cassette carrying arm 20b receives the loading cassette C1, resulting in the state where the loading cassette C1 is lifted from the cassette placing member 20a.

The substrate processing unit SPU moves the cassette carrying arm 20b lifting the loading cassette C1 in the +X direction, and then stops the movement at the standby position P2. After stopping the movement, the substrate processing unit SPU moves the cassette carrying arm 20b in −the Z direction of the cassette placing member 20a. By this operation, the cassette carrying arm 20b delivers the loading cassette C1 to cassette placing member 20a, and also the cassette carrying arm 20b moves to the −Z side of the cassette placing member 20a. The loading cassette C1 is placed on the cassette placing member 20a in the state where the bottom portion is fitted into the convex portion 20c.

The substrate processing unit SPU moves the cassette carrying arm 20b to the −Z side of the cassette placing member 20a, and then moves the cassette carrying arm 20b in the −X direction. By this operation, the cassette carrying arm 20b returns to the original position (standby position P1). Simultaneously, the substrate processing unit SPU moves the cassette carrying arm 20b disposed at the standby position P3 in −the X direction. By this operation, the cassette carrying arm 20b is placed on the −Z side of the cassette placing member 20a of the standby position P2.

The substrate processing unit SPU performs an operation of moving the cassette placing member 20a to the standby position P4 from the state where the loading cassette C1 is placed on the cassette placing member 20a at the standby position P2. By the operation, the loading cassette C1 moves from the standby position P2 to the standby position P4. In this case, the cassette carrying arm 20b disposed at the standby position P2 does not move, and only the cassette placing member 20a moves to the standby position P4. After delivering the substrate S at the standby position P4, the substrate processing unit SPU moves the cassette placing member 20a from the standby position P4 to the standby position P2. By this operation, the loading cassette C1 is returned to the standby position P2.

The substrate processing unit SPU moves the cassette carrying arm 20b disposed newly at the standby position P2 on the +X side in the drawing in the +Z direction. By this operation, the loading cassette C1 is held and lifted by the cassette carrying arm 20b. The substrate processing unit SPU lifts the loading cassette C1, moves the cassette carrying arm 20b in the +X direction, and then stops the movement at the standby position P3. After stopping the movement, the substrate processing unit SPU moves the cassette carrying arm 20b in the −Z direction, and places the loading cassette C1 on the cassette placing member 20a of the standby position P3. The loading cassette C1 is placed on cassette placing member 20a in the state where the bottom portion is fitted into the convex portion 20c in the same manner as in the carrying operation from the standby position P1 to the standby position P2.

As described above, the substrate processing unit SPU moves the cassette carrying arm 20b disposed on the −X side in the drawing between the standby position P1 and the standby position P2, and moves the cassette carrying arm 20b disposed on the +X side in the drawing between the standby position P2 and the standby position P3. By this operation, it is possible to separately carry the loading cassette C1 disposed at the standby position P1 and the loading cassette C1 disposed at the standby position P2.

The substrate processing unit SPU moves the cassette placing member 20a disposed at the standby position P2 between the standby position P2 and the standby position P4. By this operation, it is possible to move the loading cassette C1 carried to the standby position P2 to the standby position P4, and to return the loading cassette C1 at the standby position P4 to the standby position P2.

While preferred embodiments of the invention have been described and illustrated above, it should be understood that these are exemplary of the invention and are not to be considered as limiting. Additions, omissions, substitutions, and other modifications of a feature can be made without departing from the spirit or scope of the present invention. Accordingly, the invention is not to be considered as being limited by the foregoing description, and is only limited by the scope of the appended claims.

What is claimed is:

1. A coating method, comprising:
ejecting a liquid material onto front and rear surfaces of a substrate through a nozzle while rotating the substrate in a state in which the front and rear surfaces of the substrate are disposed in a vertical direction; and
adjusting a coating state of the liquid material at the outer periphery of the substrate,
wherein the adjusting includes:
dipping the outer periphery of the substrate in a solution while rotating the substrate in a state in which the front and rear surfaces of the substrate are disposed in a vertical direction to dissolve a thin film formed on the outer periphery of the substrate; and
suctioning a vicinity of the outer periphery of the substrate after dipping in the solution.

2. The coating method according to claim 1, wherein the adjusting includes adjusting a liquid level of the solution.

3. The coating method according to claim 1, wherein the adjusting includes discharging the solution used in the dipping.

4. The coating method according to claim 1, further comprising:
   carrying the substrate by a carrier between the coating and the adjusting;
   wherein the adjusting includes cleaning the carrier, wherein the carrier contains a holding portion and a rotating portion, and wherein the rotating portion contains a motor device and a rotary shaft member.

5. The coating method according to claim 1, wherein the cleaning includes second dipping in which a portion of the carrier is dipped in a solution and cleaned.

6. The coating method according to claim 1, wherein the suctioning is suctioning at a position where a portion of the substrate is held.

7. The coating method according to claim 1, wherein the suctioning includes adjusting an interposing depth of the substrate.

8. The coating method according to claim 1, further comprising raising and lowering an adjusting position of the coating state.

9. The coating method according to claim 1, further comprising:
   a second adjusting in which the coating state of the liquid material at the outer periphery of the substrate is adjusted by ejecting the solution using an adjusting nozzle.

\* \* \* \* \*